(12) United States Patent
Lim et al.

(10) Patent No.: US 12,531,524 B2
(45) Date of Patent: Jan. 20, 2026

(54) MULTI-ZONE RADIO FREQUENCY TRANSISTOR AMPLIFIERS

(71) Applicant: MACOM Technology Solutions Holdings, Inc., Lowell, MA (US)

(72) Inventors: Kwangmo Chris Lim, San Jose, CA (US); Basim Noori, San Jose, CA (US); Qianli Mu, San Jose, CA (US); Marvin Marbell, Morgan Hill, CA (US); Scott Sheppard, Chapel Hill, NC (US); Alexander Komposch, Morgan Hill, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 585 days.

(21) Appl. No.: 17/991,855

(22) Filed: Nov. 22, 2022

(65) Prior Publication Data
US 2024/0171137 A1    May 23, 2024

Related U.S. Application Data

(63) Continuation of application No. 16/911,757, filed on Jun. 25, 2020, now Pat. No. 11,533,024.

(51) Int. Cl.
*H03F 3/195* (2006.01)
*H01L 23/66* (2006.01)

(52) U.S. Cl.
CPC ............ *H03F 3/195* (2013.01); *H01L 23/66* (2013.01); *H01L 2223/6644* (2013.01)

(58) Field of Classification Search
CPC ..................................................... H03F 3/195

USPC ...................................... 330/307, 124 R, 295
See application file for complete search history.

(56) References Cited

U.S. PATENT DOCUMENTS

| | | | |
|---|---|---|---|
| 5,717,231 | A | 2/1998 | Tserng et al. |
| 8,796,843 | B1 | 8/2014 | Babic et al. |
| 9,508,652 | B1 | 11/2016 | Herrault et al. |
| 9,691,868 | B2 * | 6/2017 | Song ............... H10D 84/834 |
| 9,824,951 | B2 | 11/2017 | Leipold et al. |

(Continued)

FOREIGN PATENT DOCUMENTS

| | | |
|---|---|---|
| EP | 1008180 A1 | 6/2000 |
| EP | 3133735 A1 | 2/2017 |

(Continued)

OTHER PUBLICATIONS

"International Preliminary Report on Patentability in International Patent Application No. PCTUS21038799 mailed Jan. 5, 2023, 13 pages".

(Continued)

*Primary Examiner* — Henry Choe
(74) *Attorney, Agent, or Firm* — Myers Bigel, P.A.

(57) ABSTRACT

RF transistor amplifiers include an RF transistor amplifier die having a Group III nitride-based semiconductor layer structure and a plurality of gate terminals, a plurality of drain terminals, and at least one source terminal that are each on an upper surface of the semiconductor layer structure, an interconnect structure on an upper surface of the RF transistor amplifier die, and a coupling element between the RF transistor amplifier die and the interconnect structure that electrically connects the gate terminals, the drain terminals and the source terminal to the interconnect structure.

19 Claims, 23 Drawing Sheets

(56) References Cited

U.S. PATENT DOCUMENTS

| | | | |
|---|---|---|---|
| 10,600,718 B1 | 3/2020 | Ozard | |
| 11,217,487 B2* | 1/2022 | Lo | H10D 84/0142 |
| 11,228,287 B2* | 1/2022 | Chidurala | H03F 3/195 |
| 11,335,601 B2* | 5/2022 | Olac-Vaw | H10D 86/011 |
| 11,533,024 B2* | 12/2022 | Lim | H10D 64/257 |
| 11,677,362 B2* | 6/2023 | Brewer | H03F 3/195 |
| | | | 330/295 |
| 12,369,358 B2* | 7/2025 | Trivedi | H10D 30/6735 |
| 2006/0290421 A1 | 12/2006 | Ichitsubo et al. | |
| 2017/0372945 A1 | 12/2017 | Howard et al. | |
| 2017/0372983 A1 | 12/2017 | Howard | |
| 2019/0393130 A1 | 12/2019 | Mahnkopf et al. | |
| 2020/0006192 A1 | 1/2020 | Li et al. | |
| 2020/0027898 A1 | 1/2020 | Paul et al. | |
| 2020/0395263 A1 | 12/2020 | Kim et al. | |
| 2021/0202562 A1 | 7/2021 | Chang et al. | |
| 2021/0313293 A1 | 10/2021 | Noori et al. | |
| 2021/0399692 A1* | 12/2021 | Chidurala | H03F 3/195 |
| 2021/0408976 A1* | 12/2021 | Lim | H01L 24/05 |
| 2022/0084950 A1 | 3/2022 | Noori et al. | |
| 2023/0026676 A1* | 1/2023 | Cheng | H01L 23/5386 |
| 2024/0105692 A1* | 3/2024 | Wah | H01L 23/4334 |

FOREIGN PATENT DOCUMENTS

| | | |
|---|---|---|
| JP | 2000040705 A | 2/2000 |
| JP | 2017175424 A | 9/2017 |

OTHER PUBLICATIONS

"Notification of Transmittal of the International Search Report and the Written Opinion of the International Searching Authority, or the Declaration for corresponding International Application No. PCT/US2021/038799, mailing date: Jan. 13, 2022, (21 pages)".

* cited by examiner

MULTI-ZONE RADIO FREQUENCY TRANSISTOR AMPLIFIERS

CROSS REFERENCE TO RELATED APPLICATION

The present application is a continuation of and claims priority under 35 U.S.C. § 120 to U.S. patent application Ser. No. 16/911,757, filed Jun. 25, 2020, the entire content of which is incorporated herein by reference.

FIELD

The present invention relates to microelectronic devices and, more particularly, to radio frequency ("RF") transistor amplifiers.

BACKGROUND

Electrical circuits requiring high power handling capability while operating at high frequencies, such as R-band (0.5-1 GHZ), S-band (3 GHZ), X-band (10 GHz), Ku-band (12-18 GHz), K-band (18-27 GHz), Ka-band (27-40 GHz) and V-band (40-75 GHz) have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

Most RF transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities. RF transistor amplifiers are typically implemented in a "unit cell" configuration in which a large number of individual "unit cell" transistors are arranged electrically in parallel. An RF transistor amplifier may be implemented as a single integrated circuit chip or "die." or may include a plurality of dies. When multiple RF transistor amplifier die are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package that are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within a Group III nitride-based RF transistor amplifier die during operation. If the RF transistor amplifier die becomes too hot, its performance (e.g., output power, efficiency, linearity, gain, etc.) may deteriorate and/or the RF transistor amplifier die may be damaged. As such, Group III nitride-based RF transistor amplifiers are typically mounted in packages that may be optimized for heat removal.

FIGS. 1A through 1D are various views that schematically illustrate a conventional Group III nitride-based RF transistor amplifier die 10. In particular, FIG. 1A is a schematic plan view of the Group III nitride-based RF transistor amplifier die 10, and FIG. 1B is a cross-sectional view of the RF transistor amplifier die 10 taken along line 1B-1B of FIG. 1A. FIG. 1C is a schematic cross-sectional view taken along line 1C-1C of FIG. 1B that shows the metallization on the top surface of the semiconductor layer structure of the RF transistor amplifier die 10, and FIG. 1D is a cross-sectional view of the RF transistor amplifier die 10 taken along line 1D-1D of FIG. 1C. FIGS. 1E and 1F are schematic cross-sectional views illustrating two example ways that the RF transistor amplifier die 10 of FIGS. 1A-1D may be packaged to provide packaged RF transistor amplifiers 1A and 1B, respectively. It will be appreciated that FIGS. 1A-1F (and many of the other figures of the present application) are highly simplified diagrams, and that actual RF transistor amplifiers may include many more unit cells and various circuitry and elements that are not shown in the simplified figures herein.

As shown in FIG. 1A, the RF transistor amplifier die 10 includes a gate terminal 22 and a drain terminal 24 that are exposed on the top side of the RF transistor amplifier die 10. A first circuit element (not shown) may be connected to the gate terminal 22 by, for example, bond wires (not shown) and a second circuit element (not shown) may be connected to the drain terminal 24 by, for example, bond wires (not shown). The first circuit element may, for example, pass an input RF signal that is to be amplified to the RF transistor amplifier die 10 and the second circuit element may receive an amplified RF signal that is output by the RF transistor amplifier die 10. A protective insulating layer or pattern 28 may cover the rest of the top surface of the RF transistor amplifier die 10.

Referring to FIGS. 1B-1D, the RF transistor amplifier die 10 includes a semiconductor layer structure 30, a top-side metallization structure 20 and a back side metallization structure that acts as a source terminal 26 for the RF transistor amplifier die 10.

The semiconductor layer structure 30 includes a plurality of semiconductor layers. The RF transistor amplifier die 10 may be a HEMT-based RF transistor amplifier die, and hence the semiconductor layer structure 30 may include at least a channel layer and a barrier layer. Referring to FIG. 1D, in the depicted example, the semiconductor layer structure 30 includes a total of three layers, namely a growth substrate 32, a semiconductor channel layer 34 formed on the growth substrate 32, and a semiconductor barrier layer 36 formed on the channel layer 34 opposite the growth substrate 32. The growth substrate 32 may be a semiconductor or insulating substrate (such as a SiC or sapphire substrate). The growth substrate 32, even if formed of a non-semiconductor material, is considered to be part of the semiconductor layer structure 30.

Referring again to FIG. 1B, the semiconductor layer structure 30 has a top side 12 and a bottom side 14. The top side metallization structure 20 is formed on the top side 12 of the semiconductor layer structure 30 and the source terminal 26 is formed on the bottom side 14 of the semiconductor layer structure 30. The top side metallization structure 20 includes, among other things, a conductive (typically metal) gate manifold 42 and a conductive (typically metal) drain manifold 44, conductive gate and drain vias 43, 45, conductive gate and drain terminals 22, 24, and gate, drain and source fingers 52, 54, 56 (described below). The gate manifold 42 is electrically connected to the gate terminal 22 through the gate vias 43, and the drain manifold 44 is electrically connected to the drain terminal 24 through the conductive drain vias 45. The gate and drain vias 43, 45 may comprise, for example, metal pillars that are formed through a dielectric material such as silicon oxide or silicon nitride.

As shown in FIG. 1C, the RF transistor amplifier die 10 comprises a plurality of unit cell transistors 16, one of which is indicated by the dashed box in FIG. 1C. Each unit cell transistor 16 includes a gate finger 52, a drain finger 54 and a source finger 56. The gate, drain and source fingers 52, 54, 56 are formed on the upper surface of the semiconductor layer structure 30 and comprise part of the top side metallization structure 20. The top side metallization structure 20 further includes the gate manifold 42 and the drain manifold 44. The gate fingers 52 are electrically connected to the gate manifold 42, and the drain fingers 54 are electrically connected to the drain manifold 44. The source fingers 56 are electrically connected to the source terminal 26 (FIG. 1B) via a plurality of conductive source vias 66 that extend through the semiconductor layer structure 30. The conductive source vias 66 may comprise metal-plated vias that extend completely through the semiconductor layer structure 30.

FIG. 1E is a schematic side view of a packaged Group III nitride-based RF transistor amplifier 1A that includes the RF transistor amplifier die 10 of FIGS. 1A-1D. As shown in FIG. 1E, packaged RF transistor amplifier 1A includes the RF transistor amplifier die 10 and an open cavity package 70. The package 70 includes metal gate leads 72, metal drain leads 74, a metal submount 76, ceramic sidewalls 78 and a ceramic lid 80.

The RF transistor amplifier die 10 is mounted on the upper surface of the metal submount 76 (which may be a metal flange) in a cavity defined by the metal submount 76, the ceramic sidewalls 78 and the ceramic lid 80. The source terminal 26 of the RF transistor amplifier die 10 may directly contact the metal submount 76. The metal submount 76 may provide the electrical connection to the source terminal 26 and may also serve as a heat dissipation structure that dissipates heat that is generated in the RF transistor amplifier die 10. The heat is primarily generated in the upper portion of the RF transistor amplifier die 10 where relatively high current densities are generated in, for example, the channel regions of the unit cell transistors 16. This heat may be transferred though the source vias 66 and the semiconductor layer structure 30 to the source terminal 26 and then to the metal submount 76.

Input matching circuits 90 and/or output matching circuits 92 may also be mounted within the package 70. The matching circuits 90, 92 may be impedance matching circuits that match the impedance of the fundamental component of RF signals that are input to or output from the RF transistor amplifier 1A to the impedance at the input or output of the RF transistor amplifier die 10, respectively, and/or harmonic termination circuits that are configured to ground harmonics of the fundamental RF signal that may be present at the input or output of the RF transistor amplifier die 10. More than one input matching circuit 90 and/or output matching circuit 92 may be provided. As schematically shown in FIG. 1E, the input and output matching circuits 90, 92 may be mounted on the metal submount 76. The gate lead 72 may be connected to the input matching circuit 90 by one or more first bond wires 82, and the input matching circuit 90 may be connected to the gate terminal 22 of RF transistor amplifier die 10 by one or more second bond wires 84. Similarly, the drain lead 74 may be connected to the output matching circuit 92 by one or more fourth bond wires 88, and the output matching circuit 92 may be connected to the drain terminal 24 of RF transistor amplifier die 10 by one or more third bond wires 86. The bond wires 82, 84, 86, 88, which are inductive elements, may form part of the input and/or output matching circuits. The gate lead 72 and the drain lead 74 may extend through the ceramic sidewalls 78. The interior of the package 70 may comprise an air-filled cavity.

FIG. 1F is a schematic side view of another conventional packaged Group III nitride-based RF transistor amplifier 1B. RF transistor amplifier 1B differs from RF transistor amplifier 1A in that it includes a different package 70'. The package 70' includes a metal submount 76 (which acts as a metal heat sink and can be implemented as a metal slug), as well as gate and drain leads 72', 74'. RF transistor amplifier 1B also includes a plastic overmold 78' that at least partially surrounds the RF transistor amplifier die 10, the leads 72', 74' and the metal submount 76. Other components of RF transistor amplifier 1B may be the same as the like-numbered components of RF transistor amplifier 1A and hence further description thereof will be omitted.

SUMMARY

Pursuant to embodiments of the present invention, RF transistor amplifiers are provided that include an RF transistor amplifier die having a Group III nitride-based semiconductor layer structure and a plurality of gate terminals, a plurality of drain terminals, and at least one source terminal that are each on an upper surface of the semiconductor layer structure, an interconnect structure on an upper surface of the RF transistor amplifier die, and a coupling element between the RF transistor amplifier die and the interconnect structure that electrically connects the gate terminals, the drain terminals and the source terminal to the interconnect structure.

In some embodiments, the RF transistor amplifier die may be divided into a plurality of zones, where each of the zones includes a plurality of unit cell transistors, and where at least one of the zones can be operated independently of other of the zones. In such embodiments, a first of the zones may be configured to amplify RF signals in a first frequency range and a second of the zones may be configured to amplify RF signals in a second frequency range that is different from the first frequency range. In some embodiments, each of the zones may include a respective plurality of unit cell transistors, and where gate fingers in a first of the zones may have a first length and gate fingers in a second of the zones may have a second length that is different than the first length. In some embodiments, the RF amplifier may be configured to route RF signals to a first subset of the zones for operation in a first range of output power levels and to route RF signals to a second subset of the zones that is different than the first subset for operation in a second range of output power levels that is different than the first range of output power levels.

In some embodiments, the RF transistor amplifier may further include an input switching network and an output switching network that are configurable to switch ones of the zones into an RF transmission path between an input to the RF transistor amplifier and an output of the RF transistor amplifier. In some embodiments, at least one of the input switching network and the output switching network are provided on and/or within the interconnect structure.

In some embodiments, one of the zones comprises a redundant zone, and the RF transistor amplifier further includes a switch network that can be set to switch a transmission path from a first of the zones to the redundant zone.

In some embodiments, the unit cell transistors of a first of the zones may be electrically coupled in series with the unit cell transistors of a second of the zones.

In some embodiments, the unit cell transistors of the first of the zones may be configured as a pre-amplifier and the unit cell transistors of the second of the zones may be configured as a main amplifier.

In some embodiments, the unit cell transistors of a first of the zones may have a different configuration than the unit cell transistors of a second of the zones, and the unit cell transistors of the first of the zones and the unit cell transistors of the second of the zones may be electrically connected in parallel.

In some embodiments, the unit cell transistors of the first of the zones are configured as a main amplifier of a Doherty amplifier and the unit cell transistors of the second of the zones are configured as a peaking amplifier of the Doherty amplifier.

In some embodiments, the gate terminal for a first of the zones is coupled to a ground connection and the source terminal for a second of the zones is coupled to a ground connection.

In some embodiments, the first zone and the second zone may form a common-gate common-source amplifier.

In some embodiments, the RF transistor amplifier may further comprise an impedance matching network coupled in between an output of the first zone and an input of the second zone. In some embodiments, the impedance matching network may be on and/or within the interconnect structure.

In some embodiments, the interconnect structure may include a combining network that electrically connects a subset of the zones in parallel.

In some embodiments, each gate terminal may be coupled to an input of the RF transistor amplifier by a respective RF transmission path, where electrical lengths of the RF transmission paths are substantially equal.

In some embodiments, a first of the drain terminals may be electrically coupled in series to a second of the gate terminals.

In some embodiments, the interconnect structure may comprise a redistribution layer laminate structure or a printed circuit board. In some embodiments, a plurality of circuit elements are mounted on the interconnect structure. The circuit elements may comprise, for example, at least one of a surface mount capacitor and a surface mount inductor.

In some embodiments, sides of the RF transistor amplifier die that do not connect to the interconnect structure may be encapsulated.

In some embodiments, each zone may include a respective one of the gate terminals and a respective one of the drain terminals.

In some embodiments, the number of gate terminals may be different from the number of drain terminals.

Pursuant to embodiments of the present invention, RF transistor amplifiers are provided that include an RF transistor amplifier die having a Group III nitride-based semiconductor layer structure and a plurality of gate terminals, a plurality of drain terminals, and a source terminal that are each on an upper surface of the semiconductor layer structure. The RF transistor amplifier die is divided into a plurality of zones, where each of the zones includes a plurality of unit cell transistors, and wherein a first of the zones is electrically coupled in series with a second of the zones.

In some embodiments, the first of the zones may be electrically coupled in parallel with a third of the zones. In some embodiments, the second of the zones may be electrically coupled in parallel with a fourth of the zones.

In some embodiments, the RF transistor amplifier may further include an interconnect structure on an upper surface of the RF transistor amplifier die and a coupling element between the RF transistor amplifier die and the interconnect structure that electrically connects the gate terminals, the drain terminals and the source terminal to the interconnect structure.

In some embodiments, the unit cell transistors of the first of the zones may be configured as a pre-amplifier and the unit cell transistors of the second of the zones may be configured as a main amplifier.

In some embodiments, the gate terminal that is electrically connected to the unit cell transistors of the first of the zones may be coupled to a ground connection and the source terminal that is electrically connected to the unit cell transistors of the second of the zones may be coupled to a ground connection. In some embodiments, the first zone and the second zone may form a common-gate common-source amplifier. The RF transistor amplifier may further include an impedance matching network coupled in between an output of the first zone and an input of the second zone. The impedance matching network may be on and/or within an interconnect structure that is on an upper surface of the RF transistor amplifier die.

In some embodiments, a first of the drain terminals may be electrically coupled in series to a second of the gate terminals.

In some embodiments, the interconnect structure may be a redistribution layer laminate structure and/or a printed circuit board.

In some embodiments, each zone may include a respective one of the gate terminals and a respective one of the drain terminals.

Pursuant to still further embodiments of the present invention, RF transistor amplifiers are provided that include an RF transistor amplifier die having a Group III nitride-based semiconductor layer structure and a plurality of unit cell transistors, each unit cell transistor including a gate finger, where a first of the gate fingers has a first length and a second of the gate fingers has a second length that is different than the first length.

In some embodiments, the RF transistor amplifier die may be divided into a plurality of zones that are configured for operation in different frequency bands, and the first of the gate fingers may be in a first of the zones and the second of the gate fingers may be in a second of the zones. In some embodiments, the first of the zones may be configured to amplify RF signals in a first frequency range and the second of the zones may be configured to amplify RF signals in a second frequency range that is different from the first frequency range. In some embodiments, the RF transistor amplifier may further include an interconnect structure on a surface of the RF transistor amplifier die and a coupling element between the RF transistor amplifier die and the interconnect structure that electrically connects the RF transistor amplifier die to the interconnect structure.

In some embodiments, the interconnect structure may include a first RF input that corresponds to the first zone and a second RF input that corresponds to the second zone.

In some embodiments, a plurality of circuit elements are mounted on the interconnect structure. The circuit elements may comprise, for example, at least one of a surface mount capacitor and a surface mount inductor.

In some embodiments, the RF transistor amplifier die further may include a plurality of gate terminals, a plurality of drain terminals, and at least one source terminal, and where each of the gate terminals may be coupled to a respective one of the plurality of zones.

Pursuant to yet additional embodiments of the present invention, RF transistor amplifiers are provided that include an RF transistor amplifier die having a Group III nitride-based semiconductor layer structure and a plurality of gate manifolds, an interconnect structure on an upper surface of the RF transistor amplifier die, the interconnect structure including an RF input, a coupling element between the RF transistor amplifier die and the interconnect structure that electrically connects the RF transistor amplifier die to the interconnect structure, and a plurality of RF transmission lines that extend from the RF input to the respective gate manifolds, where each of the RF transmission lines has substantially the same electrical length.

In some embodiments, each of the RF transmission lines may have substantially the same physical length.

In some embodiments, the RF transistor amplifier die may be divided into a plurality of zones and each of the zones may include a plurality of unit cell transistors, and where each gate manifold may be connected to the unit cell transistors of a respective one of the zones.

Pursuant to yet additional embodiments of the present invention, RF transistor amplifiers are provided that include an RF transistor amplifier die having a Group III nitride-based semiconductor layer structure and an interconnect structure on an upper surface of the RF transistor amplifier die, the interconnect structure including an RF input. The RF transistor amplifier die is divided into a plurality of zones, wherein each of the zones includes a plurality of unit cell transistors, and the interconnect structure includes a switch network that is configured to selectively connect the RF input to one or more of the plurality of zones.

In some embodiments, a first of the zones may be a redundant zone and the switch network may be set to route RF signals received at the RF input to the redundant zone instead of to another of the zones that has experienced a failure.

In some embodiments, at least one of the zones may be configured to be operated independently of other of the zones.

In some embodiments, the RF amplifier may be configured to route RF signals to a first subset of the zones for operation in a first range of output power levels and to route RF signals to a second subset of the zones that is different than the first subset for operation in a second range of output power levels that is different than the first range of output power levels.

In some embodiments, one of the zones may comprise a redundant zone, and the switch network can be set to switch a transmission path from a first of the zones to the redundant zone.

Pursuant to still further embodiments of the present invention, RF transistor amplifiers are provided that include an RF transistor amplifier die that comprises a Group III nitride-based semiconductor layer structure that is divided into a plurality of zones, wherein each of the zones includes a plurality of unit cell transistors, a plurality of gate terminals, where the unit cell transistors of each zone are electrically connected to a respective one of the gate terminals, a plurality of drain terminals, where the unit cell transistors of each zone are electrically connected to a respective one of the drain terminals, and at least one source terminal.

In some embodiments, the gate terminals, the drain terminals and the at least one source terminal may all be on an upper surface of the semiconductor layer structure.

In some embodiments, at least one of the zones can be operated independently of other of the zones.

DETAILED DESCRIPTION

Figure 1A:
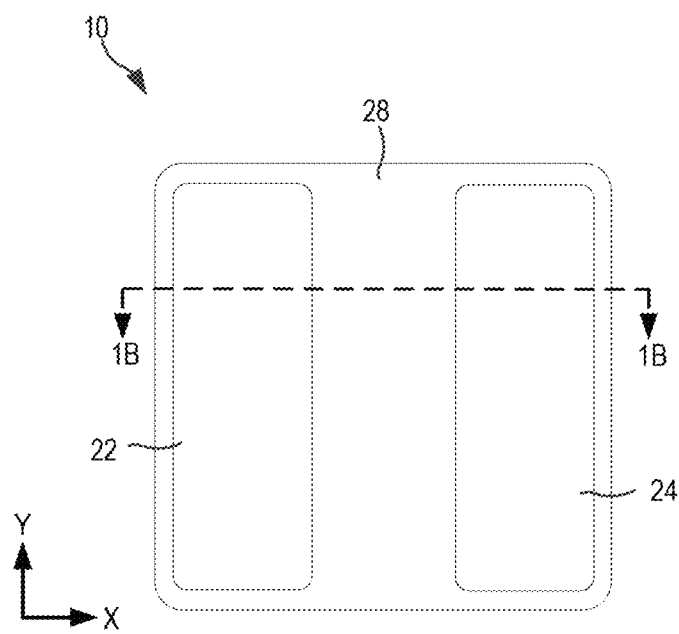
FIG. 1A is a schematic plan view of a conventional Group III nitride-based RF transistor amplifier die.
Figure 1B:
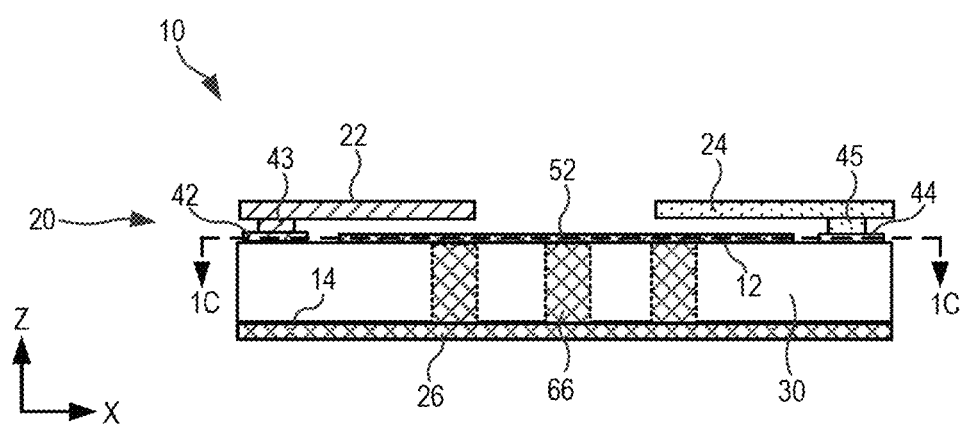
FIG. 1B is a schematic cross-sectional view taken along line 1B-1B of FIG. 1A.
Figure 1C:
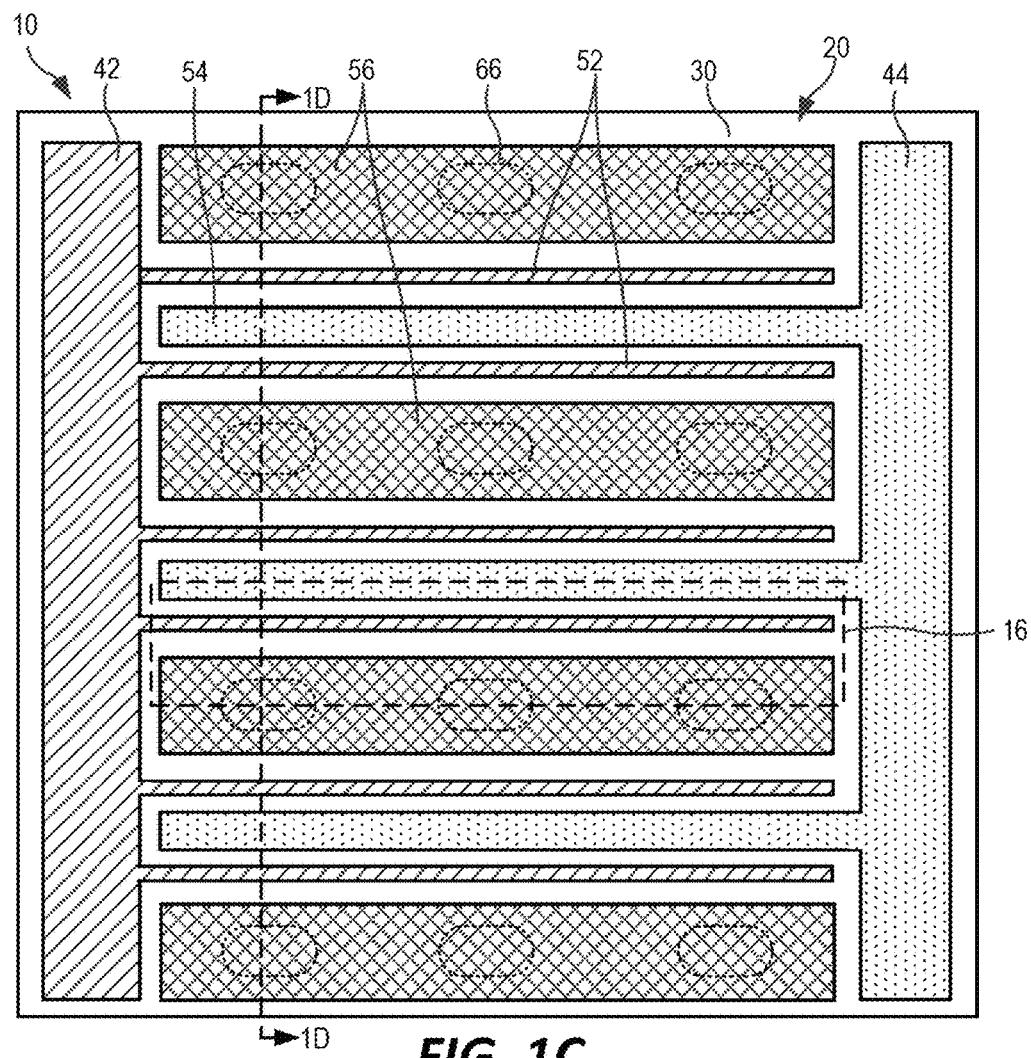
FIG. 1C is a schematic cross-sectional view taken along line 1C-1C of FIG. 1B that illustrates the metallization layers that are formed directly on the top surface of the semiconductor layer structure.
Figure 1D:
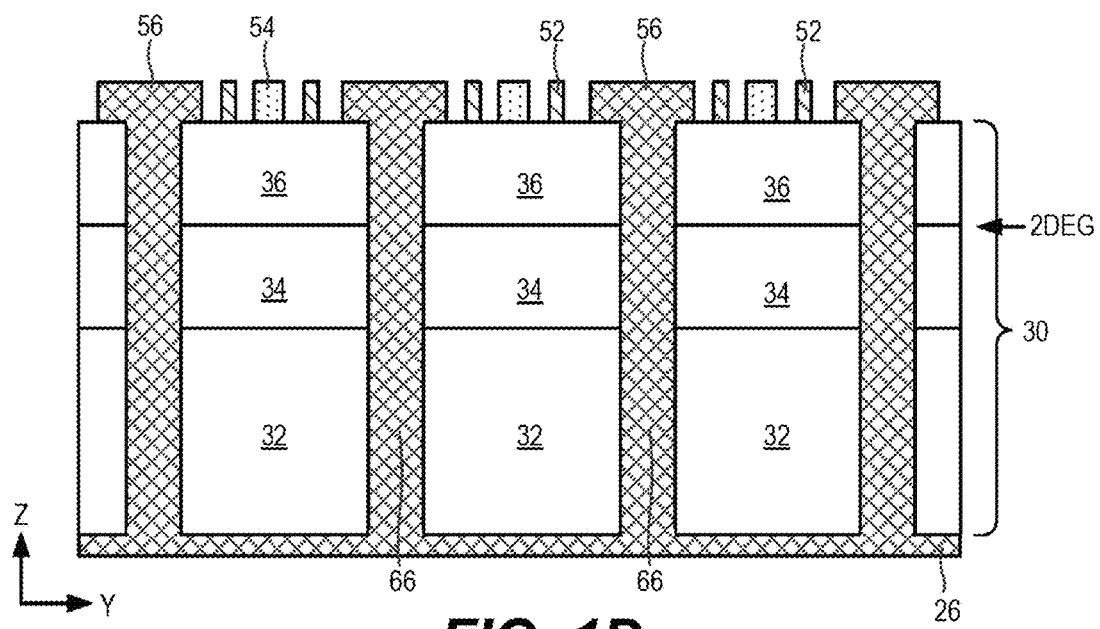
FIG. 1D is a schematic cross-sectional view taken along line 1D-1D of FIG. 1C.
Figure 1E:
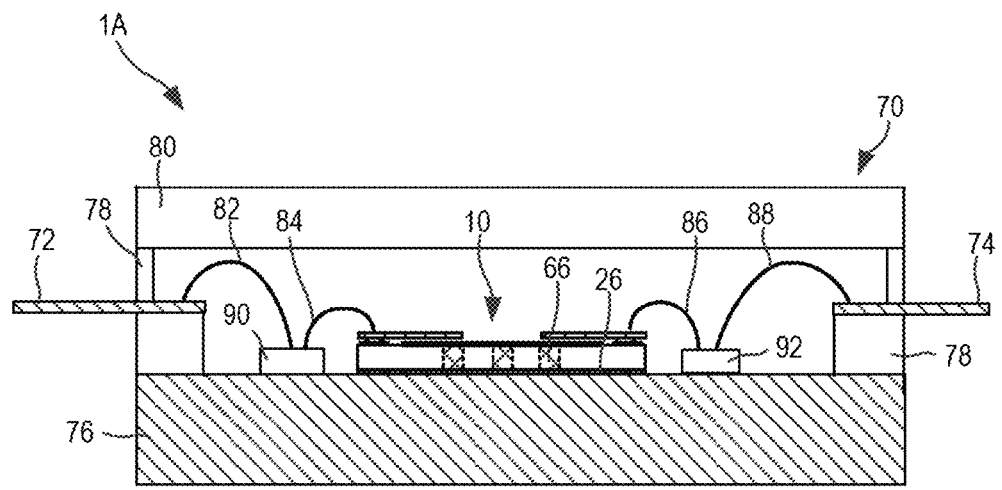
FIG. 1E is a schematic cross-sectional view of the Group III nitride-based RF transistor amplifier die of FIGS. 1A-1D packaged in a ceramic package.
Figure 1F:
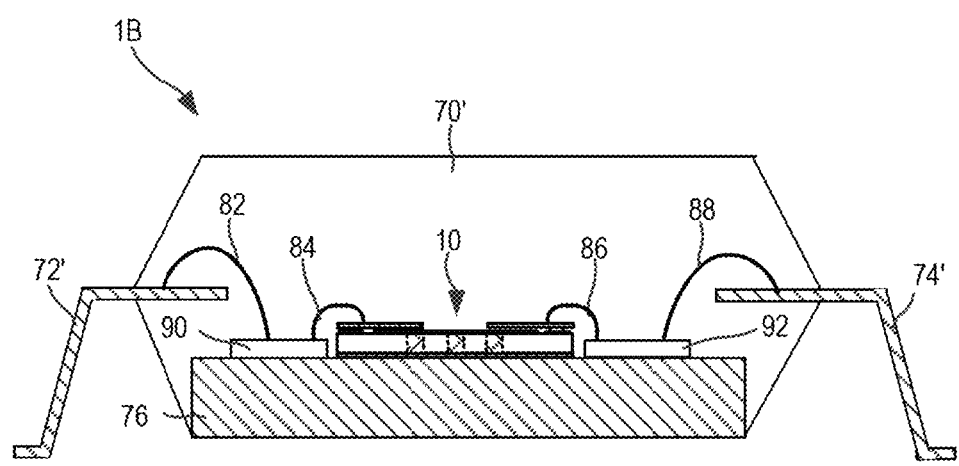
FIG. 1F is a schematic cross-sectional view of the Group III nitride-based RF transistor amplifier die of FIGS. 1A-1D packaged in an overmold package.

Pursuant to embodiments of the present invention, Group III nitride-based RF transistor amplifiers are provided that include RF transistor amplifier dies that are sub-divided into multiple different zones. Each zone may include a plurality of unit cell transistors and may operate as an individual amplifier unit. The RF transistor amplifier die may be sub-divided into multiple zones by forming multiple gate terminals and multiple drain terminals on the RF transistor amplifier die. The multiple gate terminals, multiple drain terminals, and one or more source terminals may all be located on the upper side of the RF transistor amplifier die. The RF transistor amplifier die may be connected to an interconnect structure via, for example, a coupling element. By dividing the RF transistor amplifier die into a plurality of potentially independent zones, a variety of different capabilities may be supported.

For example, in some embodiments, the RF transistor amplifiers may include a switching network that may be used to select different combinations of the zones. This may allow the RF transistor amplifier to be customized for particular applications. For instance, for low power applications, the switching network may only connect a small number of zones along the RF transmission path between the input and the output of the RF transistor amplifier, while for higher power applications, most or all of the zones may be switched into the RF transmission path. This may allow the RF transistor amplifier to be set to a configuration that will provide for high efficiency operation. The switching network may be provided on the interconnect structure in some embodiments. Moreover, in other embodiments, the switching network may be omitted, and instead different interconnect structures may be provided that each have hard-wired RF transmission lines that connect different combinations of zones of the RF transistor amplifier die along the RF transmission path between the input and the output of the RF transistor amplifier. In these embodiments, a common RF transistor amplifier die may be used and a different interconnect structure may be attached to the RF transistor amplifier die that interposes a desired number of zones along the RF transmission path.

In other embodiments, RF transistor amplifiers may be provided that include one or more built-in redundant amplifier units that may be used in the event that a primary amplifier unit fails during operation.

In still other embodiments, multi-zone Group III nitride-based RF transistor amplifiers are provided that have different zones configured for operation in different frequency bands. The gate fingers in each zone may have different lengths. These RF transistor amplifiers may, for example, allow for a single RF transistor amplifier to be used in a variety of different applications simply by selecting which zone(s) are connected to external circuits. These RF transistor amplifiers may allow a single part to be used in multiple different applications, reducing part counts and providing flexibility for integrators.

In still other embodiments, the multi-zone RF transistor amplifier die according to embodiments of the present invention may be used to implement RF amplifiers that include multiple RF transistor amplifiers using a single RF transistor amplifier die. For example, one common RF amplifier configuration includes a pre-amplifier and a main amplifier that are electrically connected in series. Such an amplifier configuration may also include one or more of input matching networks, inter-stage matching networks and output matching networks. According to embodiments of the present invention, a first subset of zones of the RF transistor amplifier die may be used to implement the pre-amplifier and a second subset of the zones of an RF transistor amplifier die may be used to implement the main amplifier. The interconnect structure may be used to electrically connect the pre-amplifier and the main amplifier in series, and the matching networks may also be implemented, at least in part, in and/or on the interconnect structure. The same technique may be used to implement multiple amplifiers in parallel (e.g., Doherty amplifier configurations) or to implement RF transistor amplifiers having other unique configurations, such as a common-gate common-source configuration, using a single RF transistor amplifier die. Moreover, as discussed above, different interposers (or a switching network on the interconnect structure) may be used to vary the number of zones included in each amplifier in these multi-amplifier circuits. This may advantageously reduce the number of RF transistor amplifier designs required.

One issue with conventional RF transistor amplifiers is that an input RF signal reaches different gate fingers of the RF transistor amplifier die at different times and hence the sub-components of the RF signal that are amplified in different portions of the die are out-of-phase with each other to some degree. This may result in degraded performance. The RF transistor amplifiers according to embodiments of the present invention may reduce or even eliminate this issue as the electrical lengths of the RF transmission paths to the respective zones may be equalized (e.g., in the interconnect structure), so that the sub-components of an RF signal that are provided to the different zones are in-phase.

Pursuant to some embodiments, RF transistor amplifiers are provided that include an RF transistor amplifier die having a Group III nitride-based semiconductor layer structure and a plurality of gate terminals, a plurality of drain terminals, and at least one source terminal that are each on an upper surface of the semiconductor layer structure. An interconnect structure is mounted on an upper surface of the RF transistor amplifier die, and a coupling element is provided between the RF transistor amplifier die and the interconnect structure that electrically connects the gate terminals, the drain terminals and the source terminal to the interconnect structure. The RF transistor amplifier die may be divided into a plurality of zones, where each of the zones includes a plurality of unit cell transistors. In some embodiments, at least one of the zones can be operated independently of other of the zones.

In one specific embodiment, a first of the zones may be configured to amplify RF signals in a first frequency range and a second of the zones may be configured to amplify RF signals in a second frequency range that is different from the first frequency range. In such an embodiment, gate fingers in the first of the zones may have a first length and gate fingers in the second of the zones may have a second length that is different than the first length.

In other embodiments, the unit cell transistors of the first of the zones may be electrically coupled in series with the unit cell transistors of the second of the zones. For example, the unit cell transistors in the first of the zones may be configured as a pre-amplifier and may be coupled in series with the unit cell transistors of the second of the zones, which may be configured as main amplifier.

In still other embodiments, the unit cell transistors of the first of the zones may be electrically coupled in parallel with the unit cell transistors of the second of the zones, and the unit cell transistors of the first of the zones have a different configuration than the unit cell transistors of the second of the zones. For example, the unit cell transistors of the first of the zones may be configured as a main amplifier of a Doherty amplifier and the unit cell transistors of the second of the zones may be configured as a peaking amplifier of the Doherty amplifier. As another example, a gate terminal for the first of the zones may be coupled to a ground connection and a source terminal for the second of the zones may be coupled to a ground connection so that the first zone and second zones form a common-gate common-source amplifier.

In some embodiments, a coupling element may be connected directly to the gate, drain, and/or source terminals of the RF transistor amplifier die. In some embodiments, the coupling element may physically and electrically connect the gate, drain, and/or source terminals of the RF transistor amplifier die to the interconnect structure. In other embodiments, the interconnect structure may be omitted, and the coupling element may physically and electrically connect the gate, drain, and/or source terminals of the RF transistor amplifier die to separately mounted components and/or leads of the RF transistor amplifier.

Embodiments of the present invention will now be discussed in further detail with reference to FIGS. 2-12D.

Figure 2:
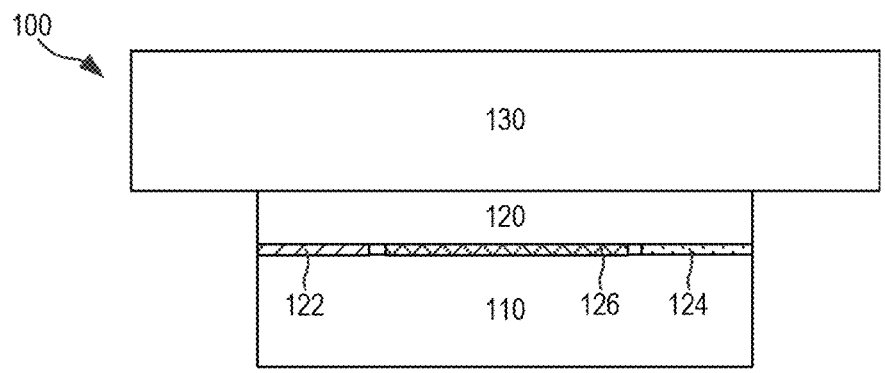
FIG. 2 is a schematic cross-sectional view illustrating some of the components of RF transistor amplifiers according to certain embodiments of the present invention.

FIG. 2 is a schematic cross-sectional view of an RF transistor amplifier 100 according to embodiments of the present invention. As shown in FIG. 2, the RF transistor amplifier 100 includes an RF transistor amplifier die 110, a coupling element 120, and an interconnect structure 130. The RF transistor amplifier die 110 may comprise a Group III nitride-based RF transistor amplifier die that includes a plurality of unit cell transistors (not shown). Each unit cell transistor may comprise a field effect transistor (e.g., a HEMT transistor) that has a gate, drain and source. At least some of the unit cell transistors may be electrically connected in parallel. The RF transistor amplifier die 110 may include a plurality of gate terminals 122, a plurality of drain terminals 124 and at least one source terminal 126. The gate terminals 122, the drain terminals 124, and the source terminal(s) 126 may all be located on the top side of the RF transistor amplifier die 110.

As is further shown in FIG. 2, the coupling element 120 is provided on the upper surface of the RF transistor amplifier die 110, and the interconnect structure 130 is provided on the upper surface of the coupling element 120. Thus, the coupling element 120 may be interposed between the RF transistor amplifier die 110 and the interconnect structure 130. In some embodiments, the coupling element 120 may comprise conductive structures (e.g., metal pillars and pads) that are formed during wafer level processing (i.e., before a semiconductor wafer that includes a plurality of RF transistor amplifier dies 110 is diced into individual RF transistor amplifier dies 110) using conventional semiconductor processing techniques and/or other methods. In such embodiments, underfill material such as capillary underfill material may be injected to fill in the space between the conductive structures of the coupling element 120. It should be noted that even if the coupling element is formed as part of wafer level processing, it will be described herein as being a separate element from the RF transistor amplifier die 110 for convenience of description. In other embodiments, the coupling element 120 may be a separate structure such as, for example, a redistribution layer ("RDL") laminate structure and/or an interposer that may be formed separately from the RF transistor amplifier die 110, and which may be attached to the RF transistor amplifier die 110 either during a wafer level processing step (i.e., before the wafer is diced into individual RF transistor amplifier dies 110) or may be applied to an individual RF transistor amplifier die 110. It should also be noted that the interconnect structure 130 may be omitted in some embodiments of the present invention, as will be described in more detail below.

Positioning all three of the gate terminals 122, the drain terminals 124 and the source terminal(s) 126 on the same side of the RF transistor amplifier die may have a number of advantages.

First, this arrangement may reduce manufacturing costs, as it may no longer be necessary to form vias through the semiconductor layer structure of the RF transistor amplifier die and in some cases the back side metallization processes may also be omitted. Moreover, the source terminal(s) may be formed in the same steps used to form the conventional top-side gate and drain terminals so that fabrication of the source terminals may not require any additional processing steps.

Second, grinding operations are typically performed on conventional RF transistor amplifier die such as the RF transistor amplifier die 10 of FIGS. 1A-1F prior to formation of the source vias 66 in order to reduce the thickness of the growth substrate. When all three of the gate, drain and source terminals are formed on the top side of the semiconductor layer structure, such grinding operation may be omitted or less grinding can be performed, which again reduces manufacturing costs. Additionally, the thicker dies may provide improvement in manufacturing yields (due to fewer cracked dies) and promote easier handling and improved thermal management capabilities.

Third, since all three of the gate, drain and source terminals are on the upper side of the RF transistor amplifier die, the RF transistor amplifiers according to embodiments of the present invention may be mounted in a flip chip arrangement in which the RF transistor amplifier die may be mounted on another substrate, such as an interconnect structure, in a stacked arrangement, as shown in FIG. 2. As such, the RF transistor amplifiers according to embodiments of the present invention may not include bond wires for the gate and/or drain connections. Bond wires have inherent inductance, which is typically used to supply some of the inductance of the impedance matching and/or harmonic termination circuits of conventional RF transistor amplifiers. The amount of inductance provided by the bond wires may be varied by changing the length and/or the cross-sectional area (e.g., the diameter) of the bond wires so that the bond wires provide a desired amount of inductance. Unfortunately, as applications move to higher frequencies, the inductance of even very short bond wires may exceed a desired amount of inductance for the impedance matching and/or harmonic termination circuits. When this occurs, the matching networks may not be able to obtain a good impedance match and/or sufficiently terminate the second or third order harmonics. Moreover, wire bonding equipment that is typically used for high volume manufacturing may have a tolerance of +/−1 mil, meaning that the length of any particular bond wire may vary by as much 4 mils (i.e., +/−1 mil on each end of the bond wire). For high frequency applications, the variation in inductance associated with 4 mils of a bond wire may be significant, and hence the performance of the matching circuits may be degraded if the bond wires are 1-2 mils too short or long from a desired nominal length. Thus, by reducing or eliminating the need for bond wires, improved matching and more consistent performance may be obtained.

Fourth, the elimination of gate and drain terminal bond wires may reduce undesired intrinsic gate-to-drain capacitance which can adversely effect device operation.

Fifth, providing all three of the gate, drain and source terminals on the same side of the RF transistor amplifier die and potentially in the same plane may facilitate mounting the RF transistor die on an interconnect structure that may include other circuit elements such as capacitors or inductors for impedance matching, combining circuits, switches and the like.

One additional advantage of locating all three of the gate, drain and source terminals on the same side of the RF transistor amplifier die is that the RF transistor amplifier die may be subdivided into a plurality of zones. This may be accomplished, for example, by splitting at least one of the gate and/or drain terminals into multiple gate and/or drain terminals. Each zone may include a plurality of unit cell transistors that are electrically connected in parallel to form respective amplifier units. The different zones/amplifier units may be connected in any appropriate fashion, including in parallel, in series, selectively connected to each other, etc. As discussed above, sub-dividing an RF transistor amplifier die into a plurality of zones may facilitate providing RF transistor amplifiers that (1) have optimized performance at different power levels, (2) can operate in multiple different frequency bands, (3) can implement multi-amplifier circuits using a single RF transistor amplifier die, (4) can exhibit improved phase performance and/or (5) can provide redundancy. Examples of RF transistor amplifiers that provide each of the above advantages will now be described in greater detail. Before describing these examples, an example of a Group III nitride-based RF transistor amplifier 200 according to certain embodiments of the present invention that includes multiple zones will first be described with reference to FIGS. 3A-3F.

Figure 3A:
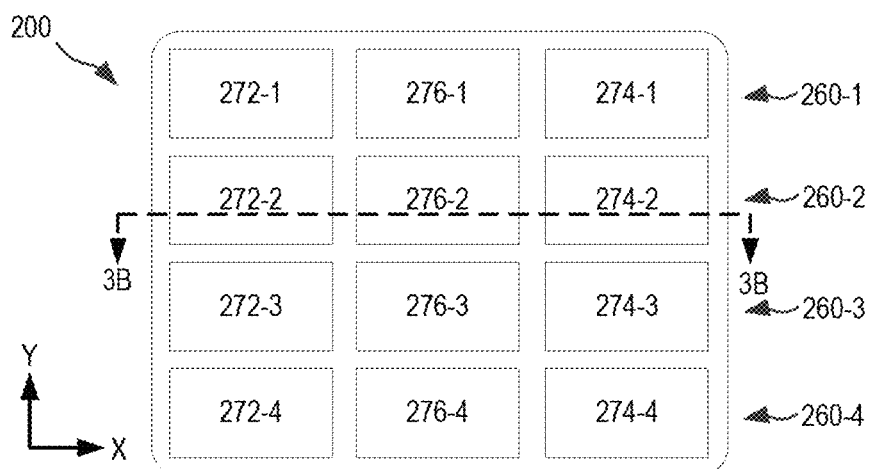
FIG. 3A is a schematic plan view of an RF transistor amplifier according to embodiments of the present invention that includes split gate, drain and source terminals.
Figure 3B:
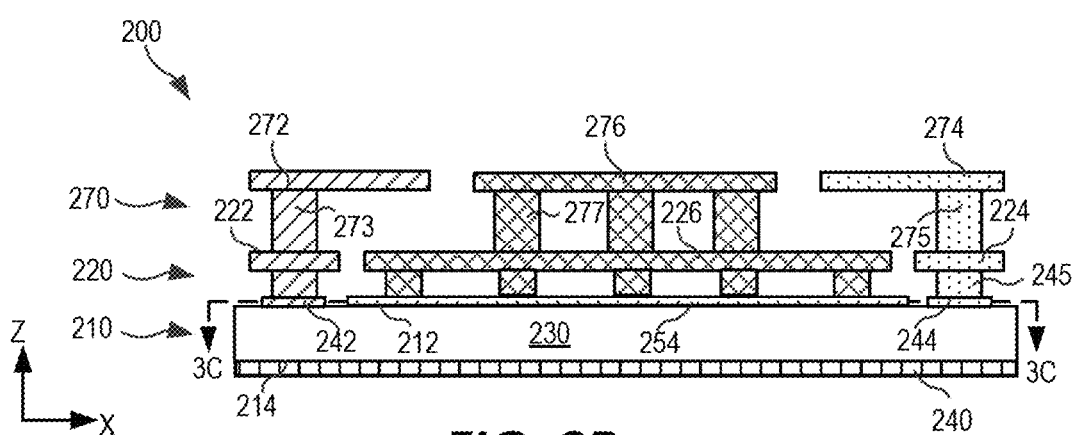
FIG. 3B is a schematic cross-sectional view taken along line 3B-3B of FIG. 3A.
Figure 3C:
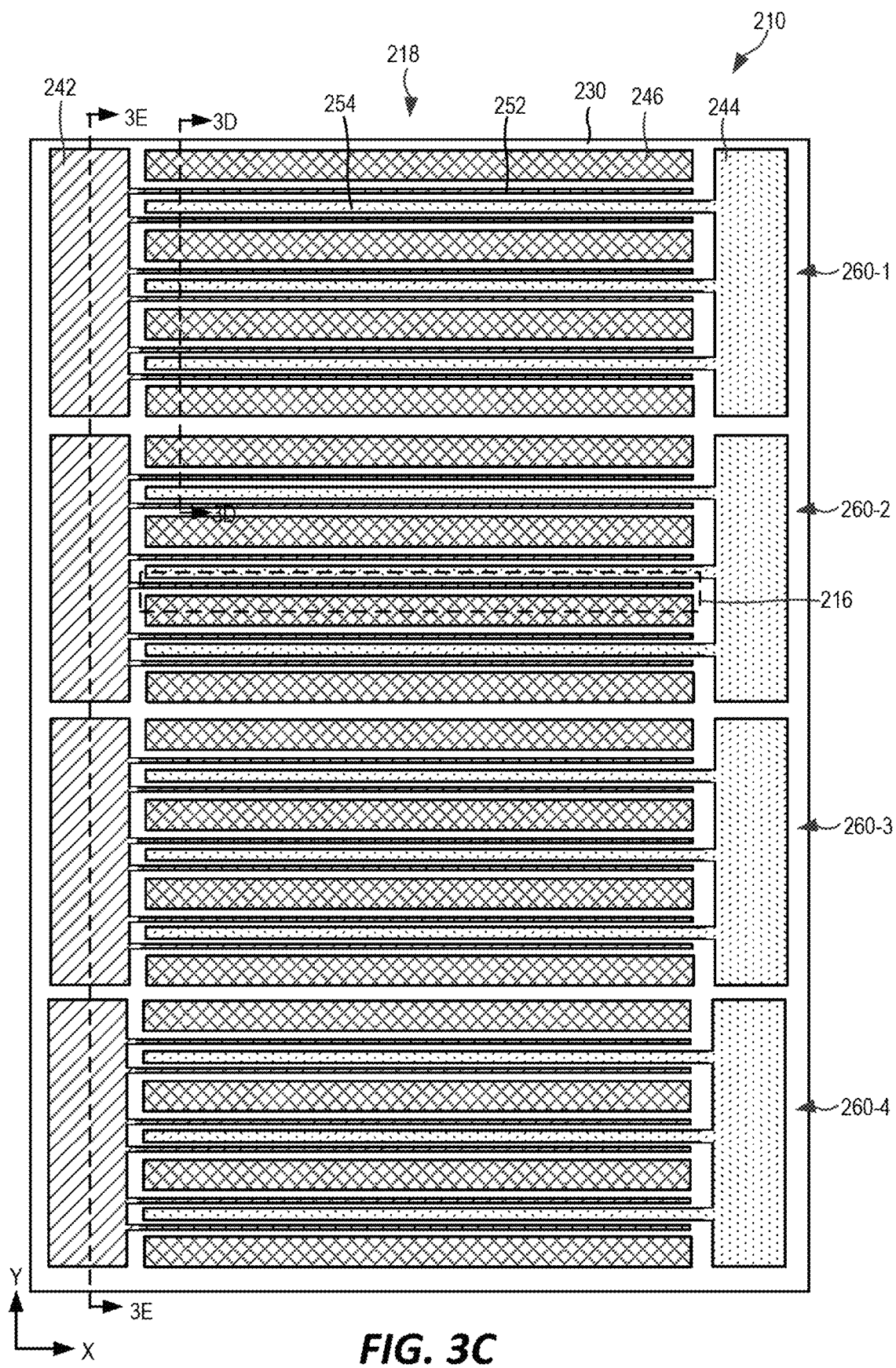
FIG. 3C is a schematic plan view taken along line 3C-3C of FIG. 3B that illustrates the top side metallization that directly contacts the semiconductor layer structure.
Figure 3D:
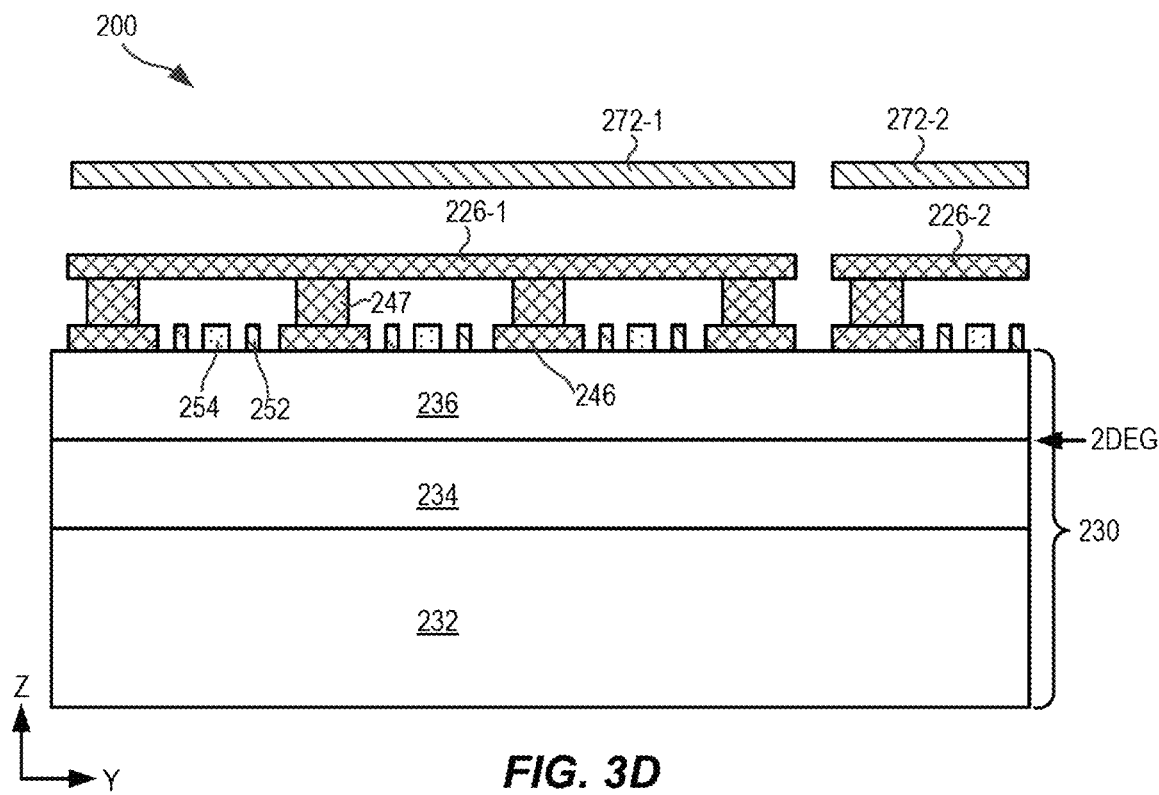
FIG. 3D is a schematic cross-sectional view taken along line 3D-3D of FIG. 3C.
Figure 3E:
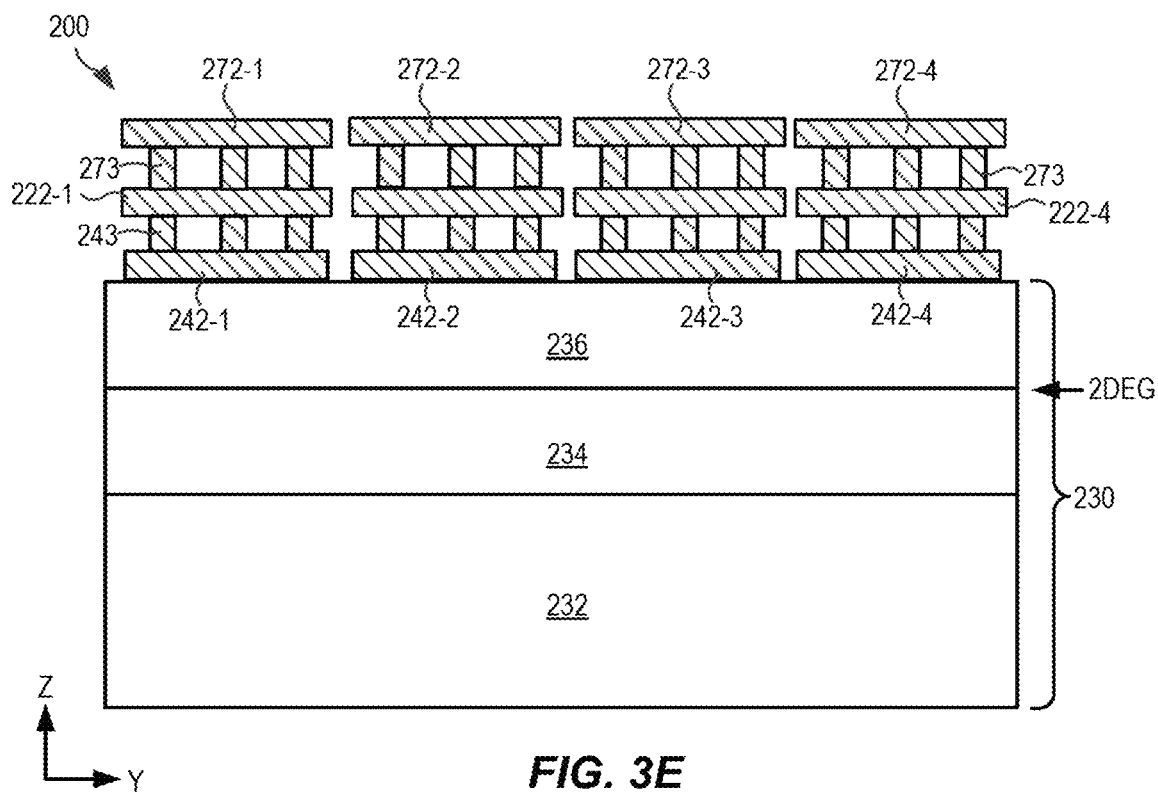
FIG. 3E is a schematic cross-sectional view taken along line 3E-3E of FIG. 3C.

In particular, FIG. 3A is a schematic plan view of the Group III nitride-based RF transistor amplifier 200. FIG. 3B is a schematic cross-sectional view of the RF transistor amplifier 200 that is taken along line 3B-3B of FIG. 3A. FIG. 3C is a schematic plan view taken along line 3C-3C of FIG. 3B that illustrates the portion of the top side metallization that directly contacts the semiconductor layer structure of the RF transistor amplifier die 210 that is included in RF transistor amplifier 200. FIGS. 3D and 3E are schematic cross-sectional views of the RF transistor amplifier 200 that are taken along lines 3D-3D and 3E-3E of FIG. 3C, respectively. FIG. 3E is a cross-sectional view of the RF transistor amplifier 200 showing how it may include and be mounted on an optional interconnect structure 300) such as a redistribution laminate structure or a printed circuit board.

Referring to FIGS. 3A and 3B, the Group III nitride-based RF transistor amplifier 200 may include an RF transistor amplifier die 210 and a coupling element 270 that is mounted on the upper surface of RF transistor amplifier die 210. As will be discussed further with reference to FIG. 3F, the RF transistor amplifier 200 may further include an interconnection structure 300. The coupling element 270 may be between the RF transistor amplifier die 210) and the interconnection structure 300 and may electrically connect the RF transistor amplifier die 210 to the interconnection structure 300. The RF transistor amplifier die 210, the coupling element 270) and the interconnection structure 300 may be in a stacked relationship or arrangement.

The RF transistor amplifier die 210 incudes a semiconductor layer structure 230) that has a top side 212 and a back side 214. A top side metallization structure 220 is formed on the top side 212 of the semiconductor layer structure 230 and a bottom side thermal layer 240 may be formed on the bottom side 214 of the semiconductor layer structure 230. The top side metallization structure 220 comprises a plurality of gate terminals 222, a plurality of drain terminals 224, and a plurality of source terminals 226, as well as other metallization that will be discussed in further detail below. The RF transistor amplifier die 210 may be a HEMT-based RF transistor amplifier die, in which case the semiconductor layer structure 230 may include at least a channel layer and a barrier layer, as will be discussed in greater detail below.

Each gate terminal 222 may receive RF signals from a first external circuit that are input to the RF transistor amplifier die 210 and couple those input RF signals to a respective one of the zones of the multi-zone RF transistor amplifier die 210. Each drain terminal 224 may output RF signals that have been amplified by a respective one of the zones of the multi-zone RF transistor amplifier die 210.

Figure 3F:
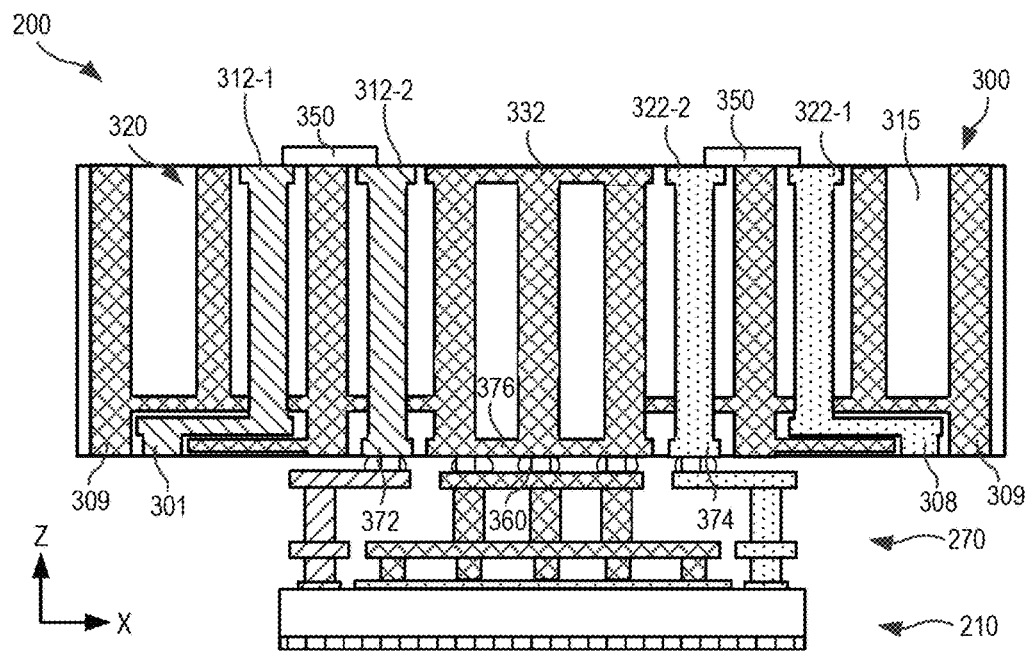
FIG. 3F is a schematic cross-sectional view of the Group III nitride-based RF transistor amplifier of FIGS. 3A-3E mounted on an interconnect structure.

The coupling element 270 is formed on top of the RF transistor amplifier die 210 on the top side metallization structure 220. The coupling element 270 may be used to connect the RF transistor amplifier die 210 to another structure, such as an interconnect structure. FIG. 3F illustrates how the coupling element 270) may be used to connect the RF transistor amplifier die 210 to an interconnect structure 300 in the form of a printed circuit board. In some embodiments, the coupling element 270 may be formed during the wafer level processing using semiconductor and/or non-semiconductor processing techniques. In other embodiments, the coupling element 270 may comprise a separate structure such as, for example, an RDL laminate structure or an interposer. An RDL laminate structure refers to a substrate that has conductive layer patterns and/or conductive vias.

As shown in FIGS. 3A-3B, the coupling element 270 includes a plurality of gate connection pads 272, a plurality of drain connection pads 274, and a plurality of source connection pads 276. Note that in the figures two-part reference numbers may be used (e.g., drain terminal 274-2) to describe like elements, and the full reference numeral may be used to refer to a specific instance of the element, while the first part of the reference numeral may be used to refer to the elements collectively. Each of these connection pads 272, 274, 276 may comprise, for example, an exposed copper pad, though the present invention is not limited thereto. Each gate connection pad 272 may be electrically coupled to a respective one of the gate terminals 222 by one or more conductive gate pillars 273. Similarly, each drain connection pad 274 may be electrically coupled to a respective one of the drain terminals 224 by one or more conductive drain pillars 275, and each source connection pad 276 may be electrically coupled to a respective one of the source terminals 226 by one or more conductive source pillars 277. While not shown in the drawings, the coupling element 270) may alternatively have a fan-in configuration or a fan-out configuration.

In some embodiment the coupling element 270 may be formed as part of a wafer level processing operation. For example, the coupling element 270 can be formed by forming the conductive gate pillars 273 on the gate terminals 222, the conductive drain pillars 275 on the drain terminals 224, and the conductive source pillars 277 on the source terminals 226. In some embodiments, the conductive pillars 273, 275, 277 may comprise copper pillars. For example, the conductive pillars may be formed by electroplating copper seed layers on the gate, drain and source terminals 222, 224, 226 and using one or more masks to form the conductive pillars 273, 275, 277 thereon. The gate connection pads 272, the drain connection pads 274, and the source connection pads 276 may then be formed on the respective gate, drain and source pillars 273, 275, 277. The conductive pillars 273, 275, 277 and the connection pads 272, 274, 276 may be disposed at least partially within an encapsulating structure (not shown), which may comprise a dielectric material. A wide variety of dielectric materials may be used including, for example, silicon oxide, silicon nitride, a polymer, a molding compound, and/or a combination thereof. The dielectric material may be processed (e.g., planarized) to expose the gate connection pads 272, the drain connection pads 274, and/or the source connection pads 276. When the coupling element 270) is formed using wafer level processes, a plurality of coupling elements 270 may be formed (one on top of each RF transistor amplifier die 210 included in the wafer), and the RF transistor amplifier die 210 may then be singulated with individual coupling elements 270 formed thereon.

In some embodiments, the coupling element 270 may be formed in a chip-first or chip-last process. In a chip-first process, the coupling element 270 may be formed directly on a wafer that includes the RF transistor amplifier die 210 (or, alternatively, on a singulated RF transistor amplifier die 210) in the manner described above. In a chip-last process, the coupling element 270 may be formed on a temporary carrier layer (not shown). The conductive pillars 273, 275, 277 and connection pads 272, 274, 276 may be formed in a manner similar to the chip-first process on the temporary carrier layer. When complete, the coupling element 270 may be decoupled from the temporary carrier layer and then coupled to the RF transistor amplifier die 210 (either as a wafer level process or a chip level process).

Other coupling elements 270 may alternatively be used such as, for example, a printed circuit board (e.g., a multi-layer printed circuit board), an RDL laminate structure, a ceramic substrate that includes conductive vias and/or pads, or any coupling that can make suitable electrical connections to the RF transistor amplifier die 210. In some configurations, as will be discussed further herein, the coupling element 270 may be omitted.

The arrangement of conductive pillars 273, 275, 277 and connection pads 272, 274, 276 illustrated in FIGS. 3A-3B are merely an example, and other arrangements are possible without deviating from the present invention.

In embodiments where the semiconductor layer structure 230 of the RF transistor amplifier die 210 has a high thermal conductivity, the back side of the RF transistor amplifier die 210 can be mounted on a thermally conductive carrier substrate or submount, such as a metal slug, leadframe, or flange, to provide improved thermal dissipation of the heat generated by the RF transistor amplifier die from the amplifier package. As noted above, an optional thermal layer 240 may be formed on the back side 214 of the semiconductor layer structure 230. The thermal layer 240 may be configured to facilitate thermal transfer between the RF transistor amplifier die 210 and the carrier substrate or submount. In some embodiments, the thermal layer 240 may be a die attach layer, such as a eutectic layer. The thermal layer 240 can be a metal layer to form a eutectic or other metal bond. In some embodiments, the thermal layer 240 can be a thermal adhesive.

FIG. 3C is a schematic plan view of RF transistor amplifier die 210 taken along line 3C-3C of FIG. 3B which shows the portion of the top side metallization structure 220) that contacts the semiconductor layer structure 230. The RF transistor amplifier die 210 may comprise a Group III nitride-based HEMT RF transistor amplifier that includes a plurality of unit cell transistors 216 that are electrically connected to each other in parallel. A dashed box in FIG. 3C highlights one of the unit cell transistors 216. The unit cell transistor 216 includes a gate finger 252, a drain finger 254, and a source finger 246 along with the underlying portion of the semiconductor layer structure 230.

As shown in FIG. 3C, the RF transistor amplifier die 210 includes a plurality of gate manifolds 242 and plurality of drain manifolds 244. A plurality of gate fingers 252 extend in the X-direction from each gate manifold 242, a plurality of drain fingers 254 extend in the X-direction from each drain manifold 244, and source fingers 246 extend parallel to the gate fingers 242. All of these elements may be formed on an upper surface of the semiconductor layer structure 230. The region between the gate manifolds 242 and the drain manifolds 244 that includes the unit cell transistors 216 is referred to as the active region 218 of RF transistor amplifier die 210.

The gate fingers 252 may be formed of materials that are capable of making a Schottky contact to a Group III nitride-based semiconductor material, such as Ni, Pt, Cu, Pd, Cr, W, and/or WSiN. The drain fingers 254 and source fingers 246 may include a metal, such as TiAlN, that can form an ohmic contact to Group III nitride-based materials. A dielectric layer (or a series of dielectric layers) that help isolate the gate manifold/fingers 242, 252, the drain manifold/fingers 244, 254 and the source fingers 246 from each other is not shown in FIG. 3C to better illustrate the elements of the RF transistor amplifier die 210.

The RF transistor amplifier die 210 is sub-divided into a plurality of zones 260. Each zone 260 includes a subset of the unit cell transistors 216. In the embodiment of FIGS. 3A-3F, the RF transistor amplifier die 210 is divided into a total of four zones 260-1 through 260-4, but embodiments of the invention are not limited thereto. In other embodiments, the RF transistor amplifier die 210 may be divided into two, three, five, six, seven, eight, nine or ten or more zones 260. In fact, in some embodiments, a large number of different zones 260 may be provided (e.g., twenty or forty zones, for example). As will be discussed in greater detail herein, dividing the RF transistor amplifier die 210 into a plurality of zones 260 may have a number of advantages and may allow the RF transistor amplifier to be configured to operate in a variety of new and different ways.

As can be seen from FIGS. 3A-3C, in some embodiments, each zone 260) may include a gate manifold 242, a drain manifold 244, a plurality of unit cell transistors 216, a gat connection pad 272, a drain connection pad 244 and a source connection pad 276. All of the gate fingers 252 within a zone 260 may be electrically connected to a common gate manifold 242, and all of the drain fingers 254 within a zone 260 may be electrically connected to a common drain manifold 244, and all of the source fingers 246 may be electrically connected together via a common source terminal 226 (discussed below). Thus, the unit cell transistors 216 within each zone 260 may be electrically connected together in parallel.

The unit cell transistors 216 may be HEMT devices. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess," issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

Referring to FIGS. 3D and 3E, the semiconductor layer structure 230) includes a growth substrate 232 and a plurality of semiconductor layers formed thereon. In the depicted embodiment, a total of two semiconductor layers are shown on the growth substrate 232, namely a channel layer 234 and a barrier layer 236 that is on a top side of the channel layer 234. The semiconductor layer structure 230 may include additional semiconductor and/or non-semiconductor layers such as optional buffer, nucleation, and/or transition layers (not shown) that may be provided on the growth substrate 232 beneath the channel layer 234. For example, an AlN buffer layer may be included to provide an appropriate crystal structure transition between an SiC growth substrate 232 and the remainder of the semiconductor layer structure 230. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein. The growth substrate 232 may comprise, for example, a 4H-SiC or 6H-SiC substrate. In other embodiments, the growth substrate may be or comprise a different semiconductor material (e.g., a Group III nitride-based material, Si, GaAs, ZnO, InP) or a non-semiconductor material (e.g., sapphire).

SiC has a much closer crystal lattice match to Group III nitrides than does sapphire ($Al_2O_3$) or silicon, which are very common substrate materials for Group III nitride devices. The closer lattice match of SiC may result in Group III nitride films of higher quality than those generally available on sapphire or silicon. SiC also has a very high thermal conductivity so that the total output power of Group III nitride devices on silicon carbide is, typically, not as limited by thermal dissipation of the substrate as in the case of the same devices formed on sapphire. Also, the availability of semi-insulating SiC substrates may provide for device isolation and reduced parasitic capacitance.

In some embodiments, the channel layer 234 is a Group III nitride material, such as $Al_xGa_{1-x}N$ where $0 \leq x < 1$, provided that the energy of the conduction band edge of the channel layer 234 is less than the energy of the conduction band edge of the barrier layer 236 at the interface between the channel and barrier layers 234, 236. In certain embodiments of the present invention, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 2 nm. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN or combinations of layers thereof with a thickness of between about 0.1 nm and about 30 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. In certain embodiments, the barrier layer 236 is undoped or doped with an n-type dopant to a concentration less than about $10^{19}$ $cm^{-3}$. In some embodiments of the present invention, the barrier layer 236 is $Al_xGa_{1-x}N$ where $0<x<1$. In particular embodiments, the aluminum concentration is about 25%. However, in other embodiments of the present invention, the barrier layer 236 comprises AlGaN with an aluminum concentration of between about 5% and about 100%. In specific embodiments of the present invention, the aluminum concentration is greater than about 10%. The barrier layer 236 may be implemented as a graded layer and/or as multiple layers in some embodiments.

Due to the difference in bandgap between the barrier layer 236 and the channel layer 234 and piezoelectric effects at the interface between the barrier layer 236 and the channel layer 234, a two dimensional electron gas (2DEG) is induced in the channel layer 234 at a junction between the channel layer 234 and the barrier layer 236. The 2DEG acts as a highly conductive layer that allows conduction between the source region of each unit cell transistor 216 and its associated drain region, where the source region is the portion of the semiconductor layer structure 230 that is directly underneath the source finger 246 and the drain region is the portion of the semiconductor layer structure 230 that is directly underneath the corresponding drain finger 254.

An insulating layer (not shown) may be formed over the gate fingers 252, the drain fingers 254, and the source fingers 246. The insulating layer may include a dielectric material, such as SiN, $SiO_2$, etc.

As shown in FIGS. 3B and 3D, each source terminal 226 may be physically and electrically connected to the source finger 246 in a given zone 260 by conductive vias 247. Likewise, as shown in FIG. 3E, each gate terminal 222 may be physically and electrically connected to a respective gate manifold 242 by conductive vias 243. The drain manifolds 244 and drain terminals 224 may have the same design as the gate manifolds 242 and the gate terminals 222, and thus each drain terminal 224 may be physically and electrically connected to a respective drain manifold 244 by conductive vias 245.

Since all of the terminals 222, 224, 226 are positioned on the top side of the RF transistor amplifier die 210, conductive vias are not required that extend through the semiconductor layer structure 230 to the back side of the RF transistor amplifier die 210. Without vias on the back side of the RF transistor amplifier die 210 connecting the source to a grounded electrically conductive submount, it becomes possible to omit the submount altogether or to use a non-conductive submount. Furthermore, the back side of the RF transistor amplifier die 210 may be coupled to a thermally conductive submount or layer 240) (see FIG. 3B) such as a heat sink to provide improved thermal dissipation. In some embodiments, the thermal layer 240 may facilitate this thermal coupling. When SiC is used as a substrate material (for substrate 232), the thermal properties of the package can be further improved due to the improved thermal conductivity of SiC.

Moreover, the placement of all of the terminals 222, 224, 226 on the top side of the RF transistor amplifier die 210, allows for the use of the coupling element 270, which can bring all of the transistor connections to respective connection pads 272, 274, 276. This may allow the RF transistor amplifier die 210 to be further coupled to other elements of the circuit (e.g., other routing elements, grounding elements, harmonic and/or input/output impedance matching elements) through the use of connection methods that avoid bonding wires.

FIG. 3F is a schematic cross-sectional view of the RF transistor amplifier 200 where the RF transistor amplifier 200 additionally includes an interconnect structure 300 that is mounted to the coupling element 270. The coupling element 270) may be used to connect the RF transistor amplifier die 210 to the interconnect structure 300. Since the RF transistor amplifier die 210 and the coupling element 270 have been discussed in detail above with reference to FIGS. 3A-3E, the discussion below will focus on the interconnect structure 300.

The interconnect structure 300 may be used to connect the RF transistor amplifier die 210 to other circuit elements. For example, the interconnect structure 300 may include one or more RF inputs 301 that receive respective RF signals that are to be coupled to respective zones 260 (or groups of zones) of the RF transistor amplifier die 210, and one or more RF outputs 308 that receive respective RF signals that are output from the RF transistor amplifier die 210. The interconnect structure 300 may further include one or more ground inputs 309 that each receives a ground reference voltage. The interconnect structure 300 may further include a plurality of gate interconnect pads 372 that may be configured to couple to the respective gate connection pads 272, a plurality of drain interconnect pads 374 that may be configured to couple to the respective drain connection pads 274, and a plurality of source interconnect pads 376 that may be configured to couple to the respective source connection pads 276 of the coupling element 270. A bonding element 360 (e.g., solder balls and/or bumps, conductive die attach material, etc.) may be used to couple the gate, drain and source interconnect pads 372, 374, 376 to the respective gate, drain and source connection pads 272, 274, 276.

Each gate, drain and source interconnect pad 372, 374, 376 may be coupled to one or more conductive patterns 320 within the interconnect structure 300. The conductive patterns 320 may provide various routing and/or circuitry within the interconnect structure 300. For example, the conductive patterns 320 may connect at least some of the gate interconnect pads 372 to one or more first surface connection pads 312 and/or to respective RF inputs 301. The conductive patterns 320 may similarly connect at least some of the drain interconnect pads 374 to one or more second surface connection pads 322 and/or to respective RF outputs 308. The conductive patterns 320 may also connect the source interconnect pad 376 to one or more third surface connection pads 332 and to one or more ground pads 309. Thus, the interconnection structure 300 may have a surface (e.g., a top surface) having a plurality of first surface connection pads 312, a plurality of second surface connection pads 322, and a plurality of third surface connection pads 332.

The conductive patterns 320 may be encased in an isolation material 315. In some embodiments, the isolation material 315 may include, for example, silicon oxide, silicon nitride, a polymer, a molding compound, a dielectric substrate or a combination thereof. In some embodiments, interconnect structure 300 may be formed as a printed circuit board (PCB). In a PCB embodiment, the isolation material 315 may be the substrate of the PCB, and the conductive patterns 320 may be traces and plated or metal filled vias that are formed within the substrate.

Circuit elements 350 may also be formed on and/or within the interconnect structure 300. For example, circuit elements 350 may be coupled (e.g., via solder or other bonding) between two or more of the first, second, and third surface connection pads 312, 322, 332. The circuit elements 350 may provide various electronic capabilities to the RF transistor amplifier 200. For example, the circuit elements 350 may comprise impedances (including, for example, resistive, inductive, and capacitive elements) that may be used for impedance matching and/or harmonic termination. The conductive patterns 320 allow the circuit elements 350 to be coupled along the input or output paths in a variety of different configurations.

Although illustrated as being on the surface of the interconnect structure 300, it will be understood that additional circuit elements 350 may be provided internally within the interconnect structure 300. For example, plate capacitors, interdigitated finger capacitors and/or capacitors formed between conductive vias may be implemented within the interconnect structure 300. Likewise spiral inductors or other inductive elements may also be implemented within the interconnect structure 300. Resistive elements may be formed on or within the interconnect structure 300 by, for example, forming trace segments or conductive vias using higher resistance conductive materials. In some embodiments, the circuit elements 350 and/or the conductive patterns 320 may be configured to provide at least part of harmonic terminating circuitry, matching circuitry, splitting circuitry, combining circuitry, and/or biasing circuitry. Other configurations of the conductive patterns 320 and/or other types of circuit elements 350 may be used without deviating from the scope of the present invention. It will also be appreciated that the configuration of the conductive patterns 320 and circuit elements 350 illustrated in FIG. 3F are merely examples and are not intended to limit embodiments of the present invention.

In some embodiments, the interconnect structure 300 and the circuit elements 350 may be optionally encased within an encapsulating material (not shown). The encapsulating material may include, for example, silicon oxide, silicon nitride, a polymer, a molding compound, or a combination thereof.

As shown in FIG. 3F, the provision of the interconnect structure 300 in conjunction with the top-side contacts of the RF transistor amplifier die 210 allows for additional functionality, such as impedance matching and/or harmonic termination, to be conveniently added to the RF transistor amplifier 200 without the use of extensive wire bonding. Thus, the functionality of an RF transistor amplifier 200 may be modified simply by using a different interconnect structure 300. The reduced or eliminated need for wire bonds may also allow for reduced die size in some applications (where the sizes of the wire bond pads drive die size), and hence the RF transistor amplifier die according to embodiments of the present invention may also exhibit increased integration density. Thus, the RF transistor amplifier die according to embodiments of the present invention may exhibit improved product assembly consistency, higher yields, increased product integration, reduced cost and improved RF performance, especially for products operating at high frequencies such as millimeter wave frequencies.

Figure 3G:
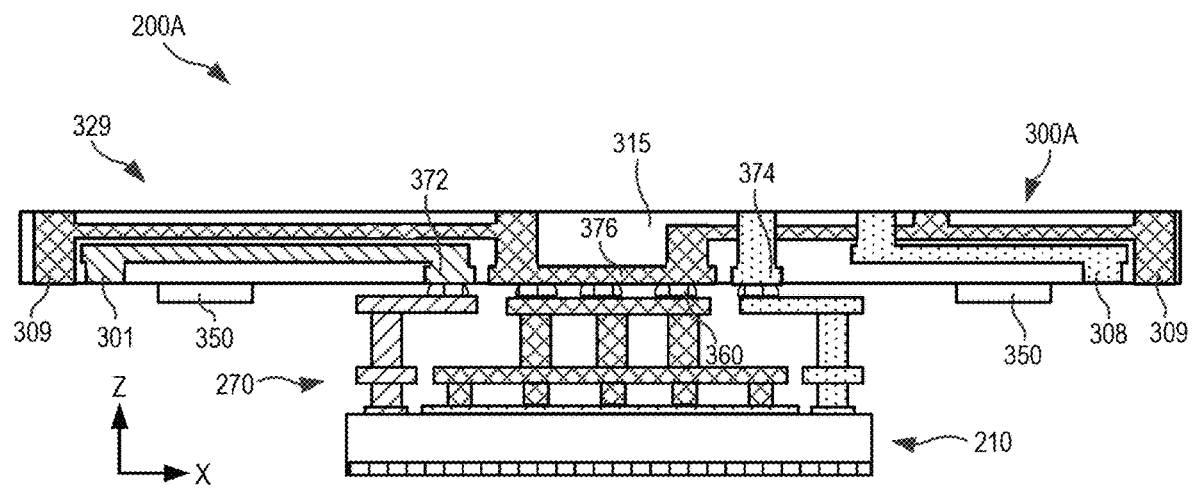
FIG. 3G is a schematic cross-sectional view of the Group III nitride-based RF transistor amplifier of FIGS. 3A-3E mounted on an alternate interconnect structure.

FIG. 3G is a schematic cross-sectional view of an RF transistor amplifier 200A which is similar to the RF transistor amplifier 200 of FIG. 3F. The difference between RF transistor amplifiers 200 and 200A is that RF transistor amplifier 200A includes an interconnect structure 300A in which the circuit elements 350) are mounted on the same side of the interconnect structure 300 as is the RF transistor amplifier die 210. It will be appreciated that in other embodiments, the circuit elements 350 may be provided on both major surfaces of the interconnect structure 300, 300A. It will also be appreciated that the RF inputs 301, the RF outputs 308, and the one or more ground inputs 309 may be provided on either major surface of the interconnect structure (and inputs 301, 308 and 309 need not all be on the same major surface). These different arrangements may facilitate different packaging schemes.

The techniques disclosed herein may be particularly beneficial in higher frequency applications as the inductance required in the matching circuits may be much lower in such applications, and hence the use of traditional bond wires may inject too much inductance. Additionally, the tolerances in the bond wire lengths may have a larger impact at higher frequencies, and in high frequency applications (particularly if lower power) the size of the bond pads may drive the size of the die. In some embodiments, any of the RF transistor amplifier dies disclosed herein may be configured to operate at frequencies greater than 1 GHZ. In other embodiments, these RF transistor amplifier dies may be configured to operate at frequencies greater than 2.5 GHZ. In still other embodiments, these RF transistor amplifier dies may be configured to operate at frequencies greater than 3.1 GHZ. In yet additional embodiments, these RF transistor amplifier dies may be configured to operate at frequencies greater than 5 GHZ. In some embodiments, these RF transistor amplifier dies may be configured to operate in at least one of the 2.5-2.7 GHZ, 3.4-4.2 GHZ, 5.1-5.8 GHZ, 12-18 GHZ, 18-27 GHZ, 27-40 GHz or 40-75 GHz frequency bands or subportions thereof.

In the above-described embodiment, the gate manifolds 242 and the gate terminals 222 are separate elements and the drain manifolds 244 and the drain terminals 224 are separate elements (e.g., connected by vias 243, 245, respectively). The present invention is not limited thereto. For example, each gate manifold 242 and its corresponding gate terminal 222 may be formed as a single monolithic structure and/or each drain manifold 244 and its corresponding drain terminal 224 may be formed as a single monolithic structure.

Though FIGS. 3A-3F illustrate a semiconductor layer structure 230) that comprises a HEMT, it will be understood that other types of semiconductor devices may be formed in the semiconductor layer structure 230 without deviating from the present invention. For example, the semiconductor layer structure 230 may include a MOSFET, a DMOS transistor, a MESFET, and/or an LDMOS transistor. One of ordinary skill in the art will recognize that the arrangement of all of the source/drain/gate contacts on a single side of the semiconductor layer structure 230, including the use of the coupling element 270, may allow for improved connection possibilities and better thermal performance.

Figure 3H:
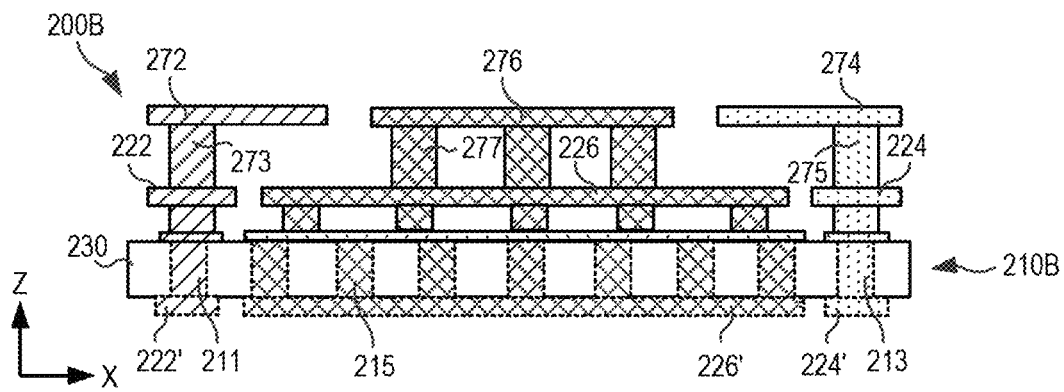
FIG. 3H is a schematic cross-sectional view of a modified version of the Group III nitride-based RF transistor amplifier of FIGS. 3A-3E.

It will also be appreciated that the RF transistor amplifier die may have a variety of different configurations. For example, while the RF transistor amplifier dies have top side gate, drain and source terminals 222, 224, 226, they may also, in some embodiments, have one or more of back side gate, drain and source terminals 222', 224', 226'. Such a configuration is schematically shown in FIG. 3H, which is a schematic cross-sectional view of an RF transistor amplifier 200B that corresponds to the cross-section of FIG. 3B. As shown in FIG. 3H, gate vias 211, drain vias 213 and/or source vias 215 may be formed through the semiconductor layer structure 230 that connect to respective gate, drain and source terminals 222', 224', 226'. As explained, for example, in U.S. Provisional Patent Application Ser. No. 63/004,985, filed Apr. 3, 2020 ("the '985 application"), including gate and drain terminals on the back side of an RF transistor amplifier die may have various advantages, such as allowing for more flexible impedance matching circuit implementations. The entire content of the '985 application is incorporated herein by reference. It will be appreciated that back side gate, drain and source terminals 222', 224', 226' and/or corresponding gate, drain and source vias 211, 213, 215 may be included in any of the RF transistor amplifier dies disclosed herein.

As discussed above, by dividing the RF transistor amplifier into a plurality of zones 260, a number of new applications can be supported. One such application is providing an RF transistor amplifier that operates in a plurality of different frequency bands. Group III nitride-based RF transistor amplifiers are widely used in cellular communications applications, particularly as amplifiers at cellular base stations. Cellular networks, however, may operate in a wide variety of bands and sub-bands, and typically separate RF transistor amplifiers are manufactured for each sub-band. Pursuant to embodiments of the present invention, a single RF transistor amplifier may be provided that can operate in two or more of the sub-bands by designing different zones 260 of the RF transistor amplifier die for operation in the particular sub-bands. A cellular radio manufacturer may then use a single RF transistor amplifier in radios that operate in different frequency bands, resulting in reduced inventory of parts and allowing for the efficiencies that can be gained with the mass production of certain parts. The radio manufacturer may connect the radio circuitry to the appropriate gate and drain connection pads that are connected to the zone 260 that is designed for operation in the operating frequency band of the radio.

Figure 4A:
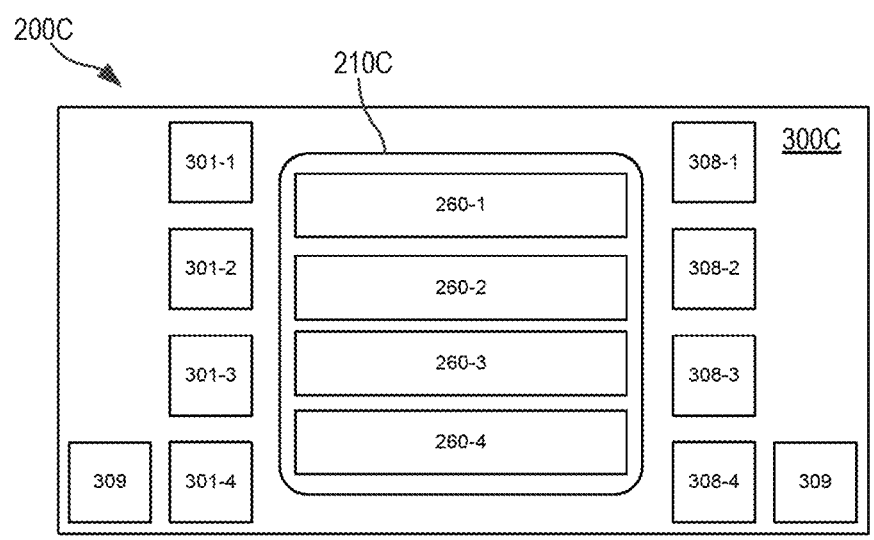
FIGS. 4A and 4B are a schematic plan view and a schematic cross-sectional view, respectively, of a Group III nitride-based RF transistor amplifier according to further embodiments of the present invention that supports operation in multiple different frequency bands.
Figure 4B:
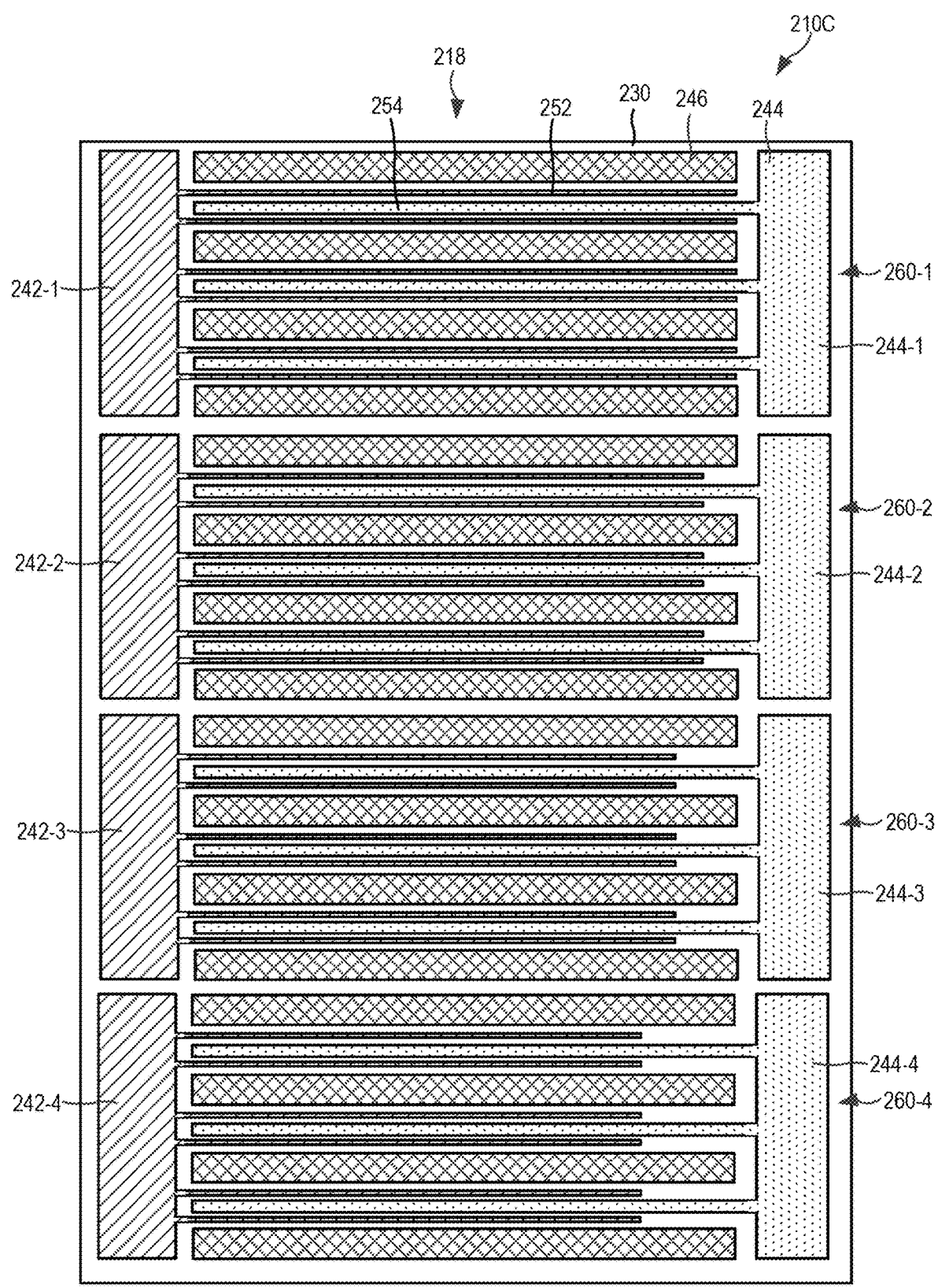

FIGS. 4A and 4B are schematic views that illustrate a Group III nitride-based RF transistor amplifier 200C according to embodiments of the present invention that supports such operation in multiple different frequency bands. In particular, FIG. 4A is a bottom view of the RF transistor amplifier 200C while FIG. 4B is a cross-sectional view through the RF transistor amplifier die 210C included in the RF transistor amplifier 200C. The cross-sectional view of FIG. 4B corresponds to the cross-section of FIG. 3C above (i.e., it shows the metallization that contacts the upper surface of the semiconductor layer structure 230) of the RF transistor amplifier die 210C), and shows how the RF transistor amplifier 200 of FIGS. 3A-3E may be modified to support operation in multiple different frequency bands.

Referring first to FIG. 4A, the RF transistor amplifier die 200C includes an RF transistor amplifier die 210C that is mounted on an interconnect structure 300C. A coupling element (not visible in the figures) may be used to mount the RF transistor amplifier die 210C on the interconnect structure 300C. The coupling element may include pillars and pads as shown above with reference to FIGS. 3A-3F, or may simply include conductive bumps (solder balls, solder pads, die attach material, etc.) or some combination of conductive bumps, pillars, pads and the like.

The interconnect structure 300C includes a plurality of RF input pads 301-1 through 301-4 and a plurality of RF output pads 308-1 through 308-4. While a total of four RF input pads 301 and RF output pads 308 are illustrated in FIG. 4A, it will be appreciated that any appropriate number of RF input pads 301 and RF output pads 308 may be provided. (e.g., two to ten or more of each in example embodiments). It will also be appreciated that the RF inputs 301 and the RF outputs 308 need not be implemented as pads and may take other forms.

Referring next to FIG. 4B, it can be seen that the RF transistor amplifier die 210C is very similar to RF transistor amplifier die 210, but the lengths of the gate fingers 252 included in RF transistor amplifier die 210 differ in the different zones 260-1 through 260-4. The length of a gate finger 252 is typically a function of frequency, with lower frequencies having longer gate fingers 252. As shown in FIG. 4B, each of zones 260-1 through 260-4 have different gate fingers 252 that have different lengths so that each zone 260 is configured to support operation in a different frequency band. A manufacturer that installs RF transistor amplifier dies in other products such as radios may purchase large numbers of the RF transistor amplifiers 200C and then use these RF transistor amplifiers 200C in radios that operate in a variety of different frequency bands. For example, many cellular radios use RF transistor amplifiers as pre-amplifiers that are used to raise the levels of RF signals that are to be input to respective main amplifiers that are implemented on other RF transistor amplifier dies. The RF transistor amplifiers 200C may serve as a multi-frequency band pre-amplifier that can be used in a wide variety of different radios.

Referring again to FIG. 4A, each RF input pad 301-1 through 301-4 may be electrically connected to a respective one of the gate manifolds 242-1 through 242-4 shown in FIG. 4B. Likewise, each RF output pad 308-1 through 308-4 may be electrically connected to a respective one of the drain manifolds 244-1 through 244-4. As described above, each gate manifold 242 and corresponding drain manifold 244 form a different one of the zones 260, where each zone 260 (or, alternatively, groups of zones) is configured for operation in a different frequency band. The RF transistor amplifier 200C may, for example, be mounted in a radio that operates in a specific frequency band and the radio circuitry may be connected to the RF input and output pads 301, 308 of RF transistor amplifier 200C that are electrically connected to the zone 260 on the RF transistor amplifier die 210C that is configured for operation in the same frequency band as the radio. The other zones 260 may not be used.

Figure 4C:
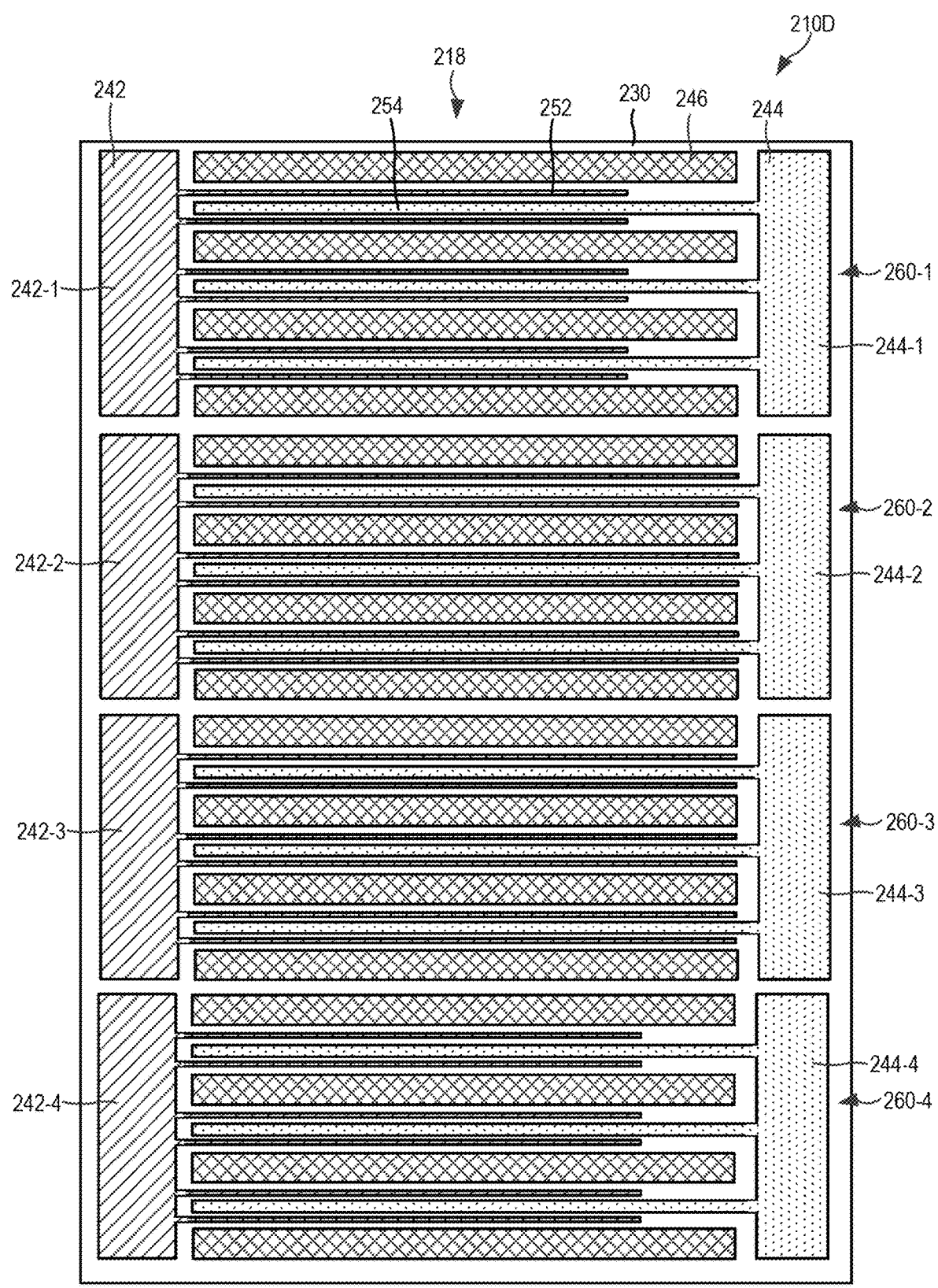
FIGS. 4C through 4E are schematic cross-sectional views of alternative RF transistor amplifier die that may be used in place of the RF transistor amplifier die included in the Group III nitride-based RF transistor amplifier of FIGS. 4A-4B.
Figure 4D:
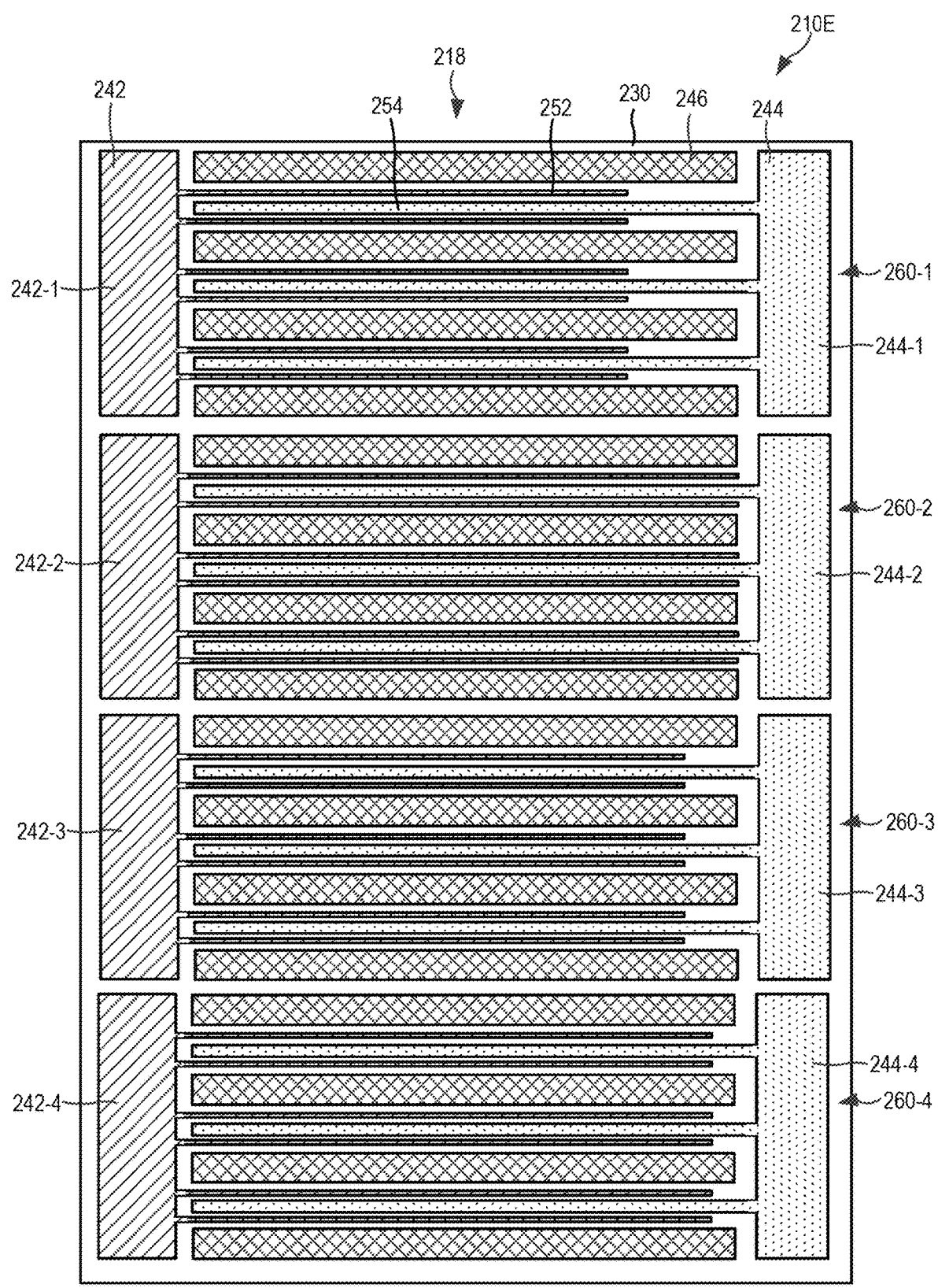

In the embodiment of FIGS. 4A and 4B, the first zone 260-1 of RF transistor amplifier die 210C is configured to operate in the lowest frequency band (as it has the longest gate fingers 252), the second zone 260-2 is configured to operate in the second lowest frequency band, the third zone 260-3 is configured to operate in the third lowest frequency band, and the fourth zone 260-4 is configured to operate in the highest frequency band. It will be appreciated, however, that the zones 260 may be arranged in any appropriate fashion within the RF transistor amplifier die 210C. For example. FIGS. 4C and 4D, illustrate a pair of RF transistor amplifier die 210D. 210E that may be used in place of RF transistor amplifier die 210C of FIG. 4B. RF transistor die 210D is configured to operate in two different frequency bands, and has two zones 260 dedicated to each frequency band (namely zones 260-2 and 260-3 are configured to operate in the lower frequency band and zones 260-1 and 260-4 are configured to operate in the higher frequency band). RF transistor amplifier die 210D may be part of an RF transistor amplifier that includes an interconnect structure similar to the interconnect structure 300C of FIG. 4A, except that the interconnect structure used with RF transistor amplifier die 210D may only have two RF input pads 301 and two RF output pads 308. RF transistor amplifier die 210E of FIG. 4D shows another variation where the second zone 260-2 is configured to operate in the lowest frequency band, the fourth zone 260-4 is configured to operate in the second lowest frequency band, the third zone 260-3 is configured to operate in the third lowest frequency band, and the first zone 260-1 is configured to operate in the highest frequency band. Many other variations are possible.

Figure 4E:
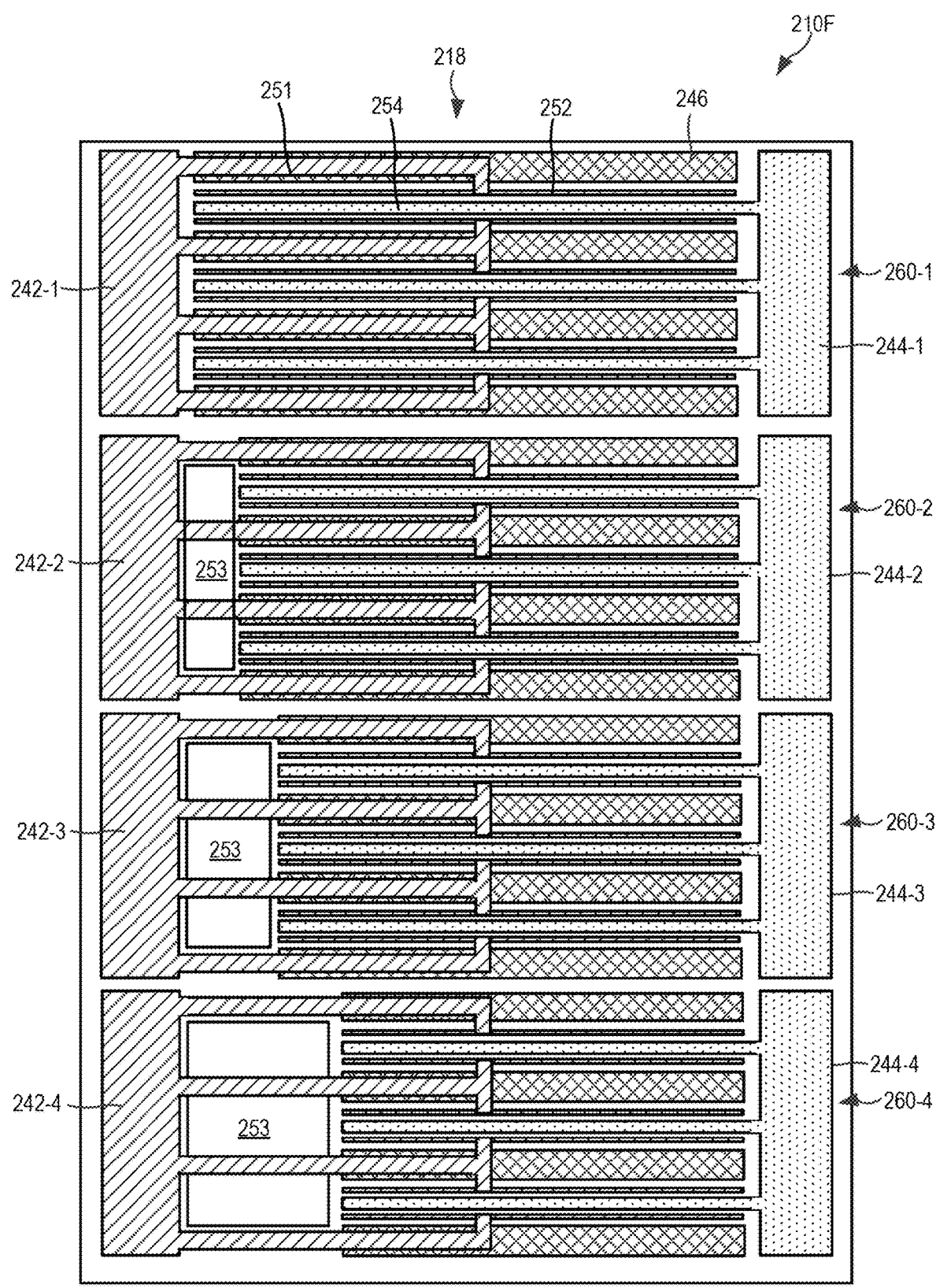

While FIGS. 4A-4D illustrate embodiments where the lengths of the gate fingers 252 included in RF transistor amplifier die 210 are varied so that each zone 260-1 through 260-4 will operate in a different frequency band, embodiments of the present invention are not limited thereto. As shown in FIG. 4E, in other embodiments the length of the drain fingers 254 may be varied. In such embodiments gate jumpers 251 may be used to center feed the gate fingers 252. In such an embodiment it is possible to shorten both the gate fingers 252 and the drain fingers 254 for the zones operating at higher frequency bands. The extra room on the die provided in these areas may be used for other purposes such as, for example, for on-chip input impedance matching circuitry 253 which is schematically shown in FIG. 4E.

Pursuant to further embodiments of the present invention, Group III nitride-based RF transistor amplifiers are provided that take advantage of the multi-zone layout of the RF transistor amplifier die according to embodiments of the present invention to implement RF transistor amplifiers that include more than one RF transistor amplifier circuit using a single RF transistor amplifier die. FIGS. 5A through 8B illustrate four example RF transistor amplifiers according to embodiments of the present invention that include multiple different RF transistor amplifiers on a single RF transistor amplifier die.

Figure 5A:
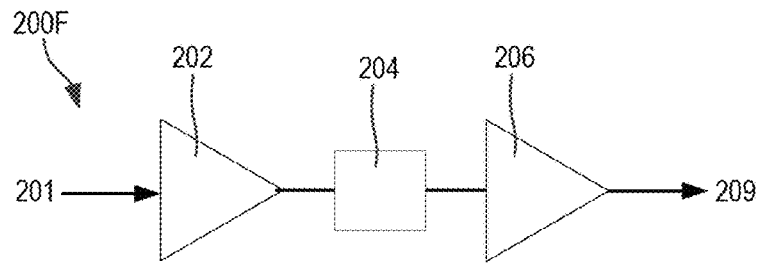
FIGS. 5A-5C are schematic views of an RF transistor amplifier according to embodiments of the present invention that includes both a pre-amplifier and a main amplifier in a single RF transistor amplifier die.
Figure 5B:
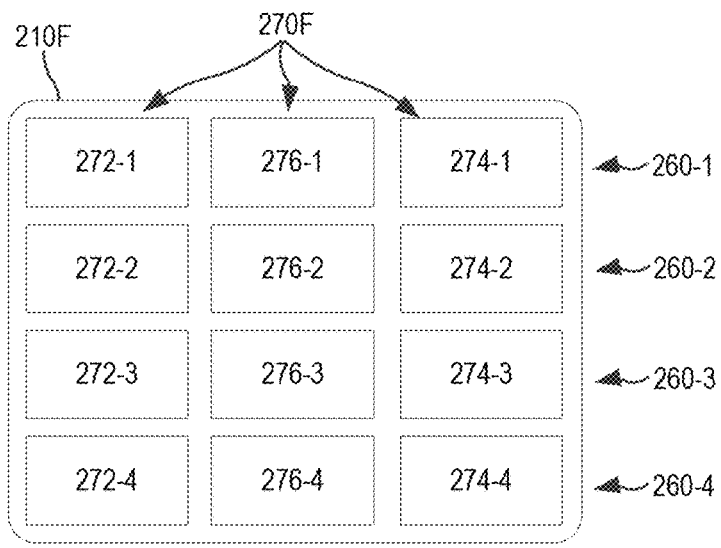
Figure 5C:
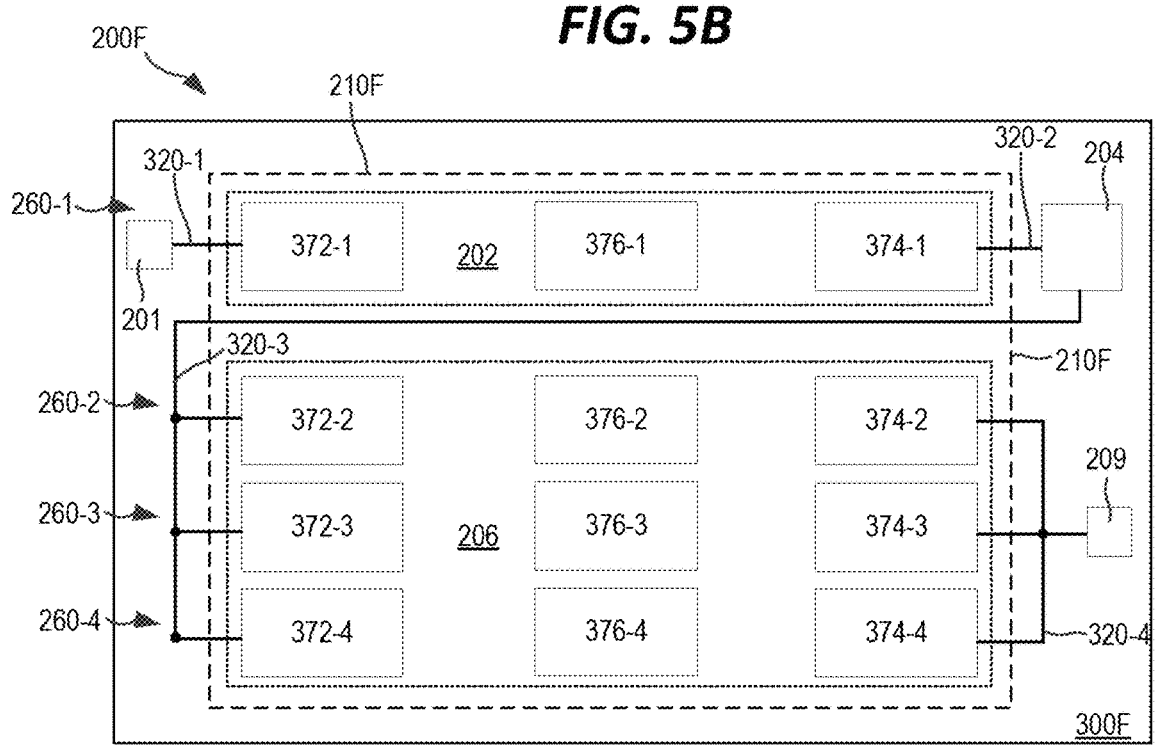

Referring first to FIGS. 5A-5C, an RF transistor amplifier 200F according to embodiments of the present invention is depicted that includes a pre-amplifier and a main amplifier that are electrically connected in series. FIG. 5A is a block diagram of RF transistor amplifier 200F, while FIG. 5B is a schematic plan view of the RF transistor amplifier die 210F and coupling element 270F of the RF transistor amplifier 200F of FIG. 5A. FIG. 5C is a schematic block diagram that illustrates how the zones of RF transistor amplifier die 210F can be interconnected (e.g., using the interconnect structure 300F) to implement the RF transistor amplifier 200F of FIG. 5A.

As shown in FIG. 5A, RF transistor amplifier 200F includes an RF input 201, a pre-amplifier 202, an inter-stage impedance matching network 204, a main amplifier 206, and an RF output 209. While not shown in FIGS. 5A-5C, RF transistor amplifier 200F may further include an input matching network that is interposed between RF input 201 and pre-amplifier 202, and/or an output matching network that is interposed between the main amplifier 206 and the RF output 209. If included, the input matching network and/or the output matching network may be implemented, for example, on or in the interconnect structure 300F of RF transistor amplifier 200F.

As shown in FIG. 5B, the RF transistor amplifier die 210F that is included in RF transistor amplifier 200F is divided into a plurality of zones 260-1 through 260-4. As discussed above, each zone 260 includes a plurality of unit cell transistors 216. The unit cell transistors of a particular zone 260 may be connected to a corresponding gate manifold 242 and a corresponding drain manifold 244. The gate manifolds 242 may be connected to respective gate terminals 222, which in turn may be coupled through respective gate connection pads 272 to respective gate interconnect pads 372 on the interconnect structure 300F. Similarly, the drain manifolds 244 may be connected to respective drain terminals 224, which in turn may be coupled through respective drain connection pads 274 to respective drain interconnect pads 374 on the interconnect structure 300F. Thus, an RF signal that is input to a particular gate interconnect pad 372 will be amplified by a corresponding zone 260 of the RF transistor amplifier die 210F, and the amplified signal will be output to a particular drain interconnect pad 374.

FIG. 5C illustrates how the different zones 260-1 through 260-4 of RF transistor amplifier die 210F may be configured to provide, using a single RF transistor amplifier die 210F, the RF transistor amplifier 200F of FIG. 5A that includes a pre-amplifier 202, an inter-stage impedance matching network 204 and a main amplifier 206. In particular, as shown in FIG. 5C, the RF transistor amplifier die 210F is mounted on an interconnect structure 300F. The RF input 201 may be implemented on the interconnect structure 300F. The interconnect structure 300F may include conductive structures 320-1 that electrically connect the RF input 201 to the gate interconnect pad 372-1. As described above, the gate interconnect pad 372-1 may be electrically connected to the first zone 260-1 of RF transistor amplifier die 210F. The first zone 260-1 of RF transistor amplifier die 210F may imple- ment the pre-amplifier 202, and may amplify an RF signal that is input at RF input 201. The first zone 260-1 may output the amplified RF signal to drain interconnect pad 374-1. Conductive structures 320-2 on interconnect structure 300F may electrically connect drain interconnect pad 374-1 to the inter-stage impedance matching network 204.

The inter-stage impedance matching network 204 may include, for example, inductors and/or capacitors arranged in any appropriate configuration in order to form a circuit that improves the impedance match between the output of pre-amplifier 202 and the input of main amplifier 206. The capacitors may be implemented, for example, as surface mount components on the interconnect structure 300F or as plate or interdigitated finger capacitors implemented within the interconnect structure 300F. The inductors may be implemented, for example, as surface mount components on the interconnect structure 300F, as bond wires, or as elongated and/or narrowed conductive trace segments (which may have spiral configurations) on or within the interconnect structure 300F.

Conductive structures 320-3 on and/or within interconnect structure 300F may electrically connect the output of the inter-stage impedance matching network 204 to the gate interconnect pads 372-2 through 372-4, which are electrically connected to zones 260-2 through 260-4 of RF transistor amplifier die 210F. Zones 260-2 through 260-4 form the main amplifier 206 of FIG. 5A. Zones 260-2 through 260-4 may be electrically connected to each other in parallel and may be electrically connected to zone 260-1 in series. RF signals that are amplified by pre-amplifier 202 may be input to zones 260-2 through 260-4 where the RF signals are further amplified. The amplified RF signal output by the main amplifier 206 is passed to drain interconnect pads 374-2 through 374-4, and conductive structures 320-4 carry the amplified RF signal to RF output 209, which may comprise a pad on interconnect structure 300F.

Figure 6A:
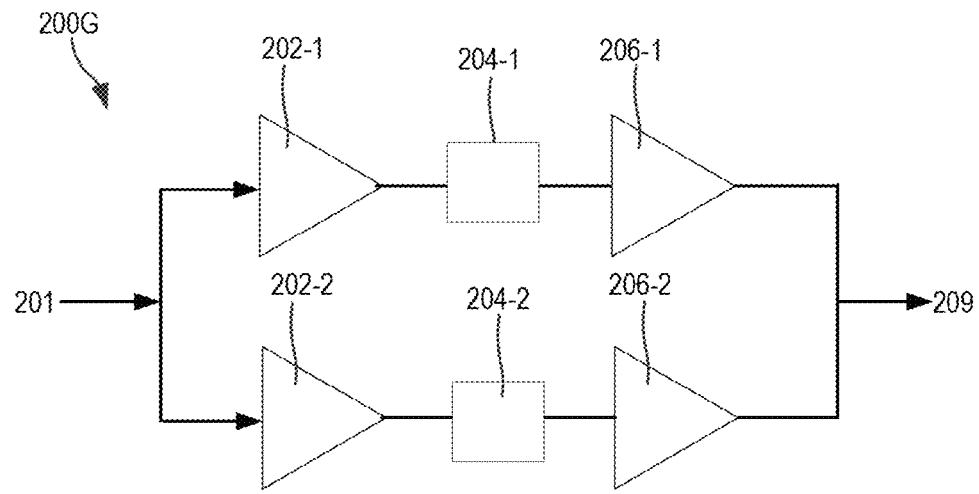
FIGS. 6A-6C are schematic views of an RF transistor amplifier according to embodiments of the present invention that includes both two pre-amplifiers and two main amplifiers in a single RF transistor amplifier die.
Figure 6B:
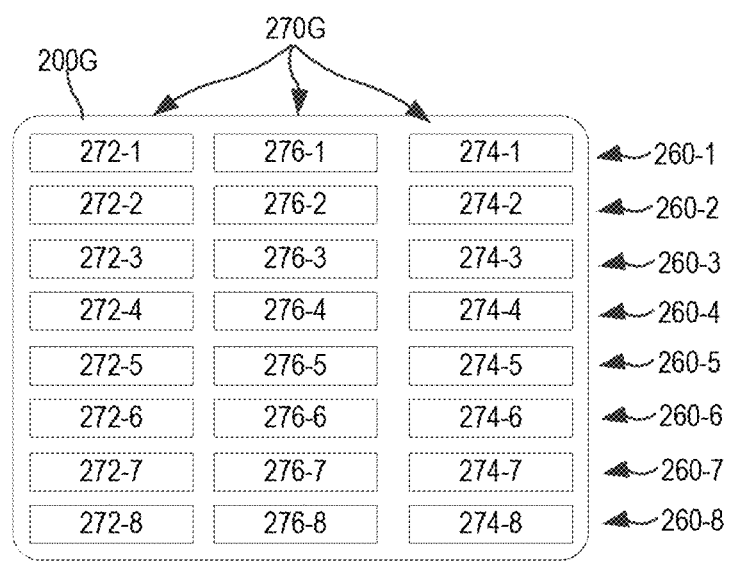
Figure 6C:
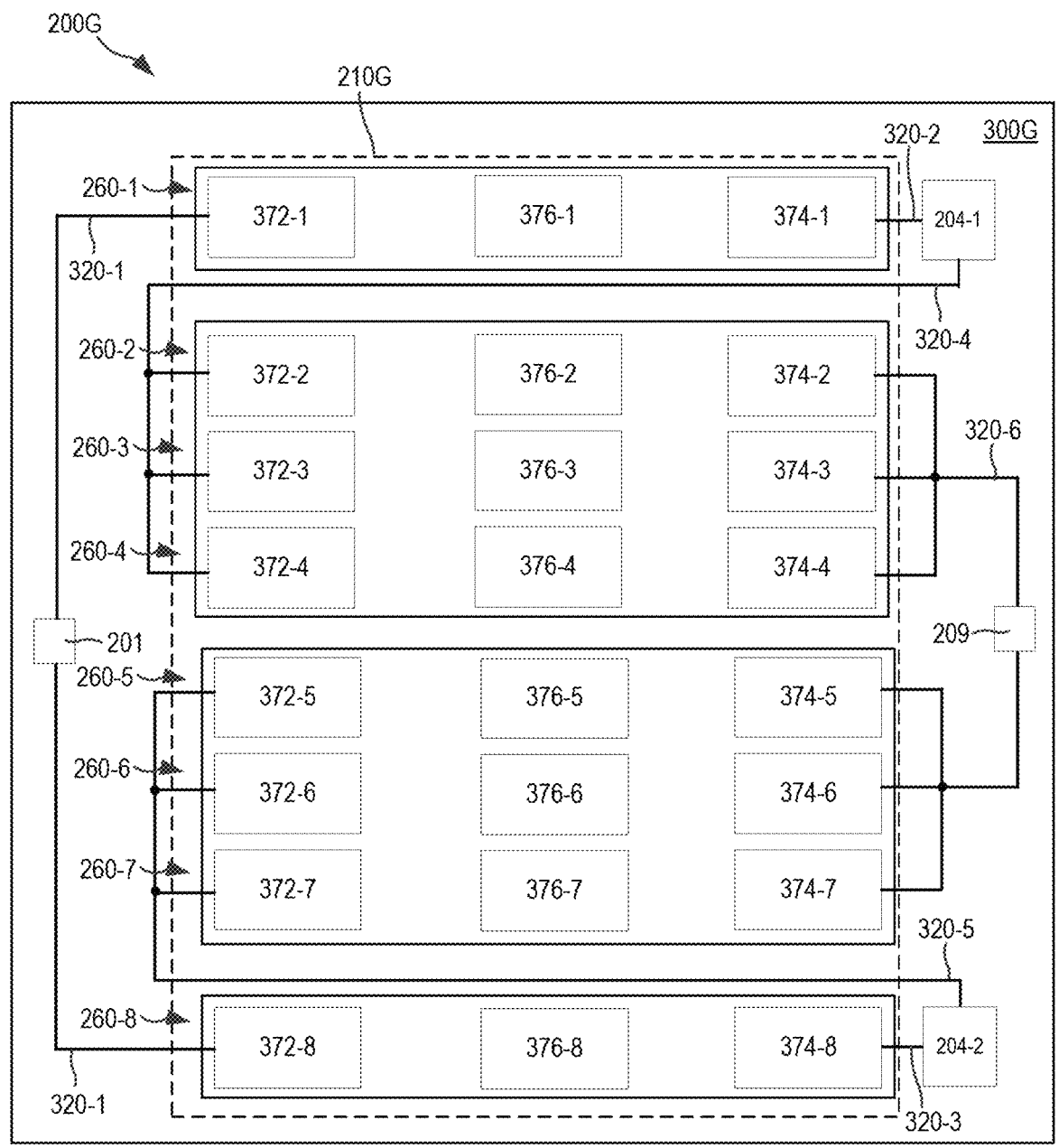

FIGS. 5A-5C illustrate one example how the multi-zone RF transistor amplifier die according to embodiments of the present invention may be used to implement amplifier circuits that include multiple individual amplifiers. FIGS. 6A-6C are similar figures that illustrate another example implementation of an amplifier circuit that includes multiple individual amplifiers.

Referring first to FIG. 6A, an RF transistor amplifier 200G is shown that includes an RF input 201, a pair of pre-amplifiers 202-1, 202-2, a pair of inter-stage impedance matching networks 204-1, 204-2, a pair of main amplifiers 206-1, 206-2, and an RF output 209. Pre-amplifier 202-1 and main amplifier 206-1 (which are electrically connected in series) are arranged electrically in parallel with pre-amplifier 202-2 and main amplifier 206-2 (which are electrically connected in series). As with the RF transistor amplifier 200F of FIGS. 5A-5C, RF transistor amplifier 200G may further include an input matching network that is interposed between RF input 201 and pre-amplifiers 202-1, 202-2, and/or an output matching network that is interposed between the main amplifiers 206-1, 206-2 and the RF output 209.

As shown in FIG. 6B, the RF transistor amplifier die included in RF transistor amplifier 200G is divided into a total of eight zones 260-1 through 260-8, with each zone 260. The unit cell transistors of each zone 260 are connected to a corresponding gate manifold 242 and a corresponding drain manifold 244. Each gate manifold 242 is connected to a respective gate terminal 222, which in turn is coupled through respective gate connection pads 272 to respective gate interconnect pads 372 on the interconnect structure 300G. Similarly, each drain manifold 244 is connected to respective drain terminal 224, which in turn is coupled through respective drain connection pads 274 to respective drain interconnect pads 374 on the interconnect structure 300G. Thus, an RF signal that is input to a particular gate interconnect pad 372 will be amplified by a corresponding zone 260 of the RF transistor amplifier die 210G, and the amplified signal will be output to a particular drain interconnect pad 374.

FIG. 6C illustrates how the different zones 260 of RF transistor amplifier die 210G may be interconnected to implement the RF transistor amplifier 200G of FIG. 6A. As shown in FIG. 6C, RF transistor amplifier die 210G is mounted on an interconnect structure 300G that includes an RF input 201 and an RF output 209. Conductive structures 320-1 on interconnect structure 300G electrically connect the RF input 201 to gate interconnect pads 372-1 and 372-8 in order to pass RF signals input to RF transistor amplifier 200G to pre-amplifiers 202-1 and 202-2. Drain interconnect pad 374-1 is electrically connected by conductive structures 320-2 on interconnect structure 300G to the first inter-stage impedance matching network 204-1 and drain interconnect pad 374-8 is electrically connected by conductive structures 320-3 on interconnect structure 300G to the second inter-stage impedance matching network 204-2. Inter-stage impedance matching networks 204-1, 204-2 may be similar or identical to inter-stage impedance matching network 204, and hence further description thereof will be omitted.

Conductive structures 320-4 on interconnect structure 300G may electrically connect the output of the inter-stage impedance matching network 204-1 to gate interconnect pads 372-2 through 372-4, and conductive structures 320-5 on interconnect structure 300G may electrically connect the output of the inter-stage impedance matching network 204-2 to gate interconnect pads 372-5 through 372-7. Zones 260-2 through 260-4 of RF transistor amplifier die 210G form the first main amplifier 206-1 of FIG. 5A, and zones 260-5 through 260-7 of RF transistor amplifier die 210G form the second main amplifier 206-2 of FIG. 5A. RF signals amplified by main amplifier 206-1 are output to drain interconnect pads 374-2 through 374-4, and RF signals amplified by main amplifier 206-2 are output to drain interconnect pads 374-5 through 374-7. Drain interconnect pads 374-2 through 374-7 may be electrically connected together and connected to RF output 209 by conductive structures 320-6 on interconnect structure 300G.

According to still further embodiments of the present invention, Doherty amplifiers may be implemented using a single RF transistor amplifier die. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

Figure 7A:
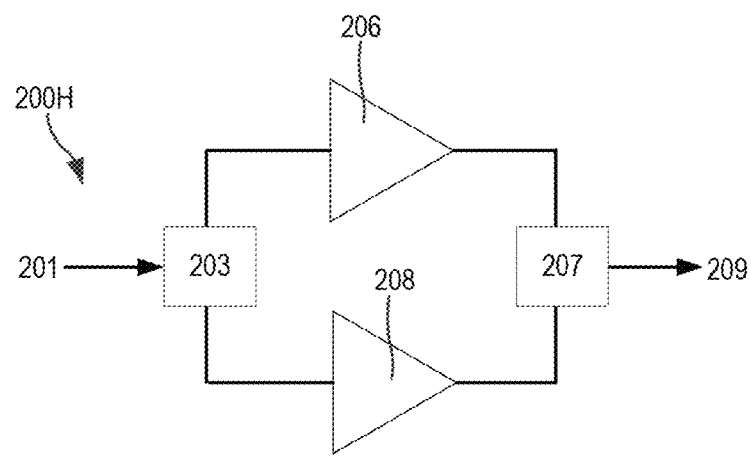
FIGS. 7A-7D are schematic views of an RF transistor amplifier having a Doherty amplifier configuration that is implemented using a single RF transistor amplifier die.
Figure 7B:
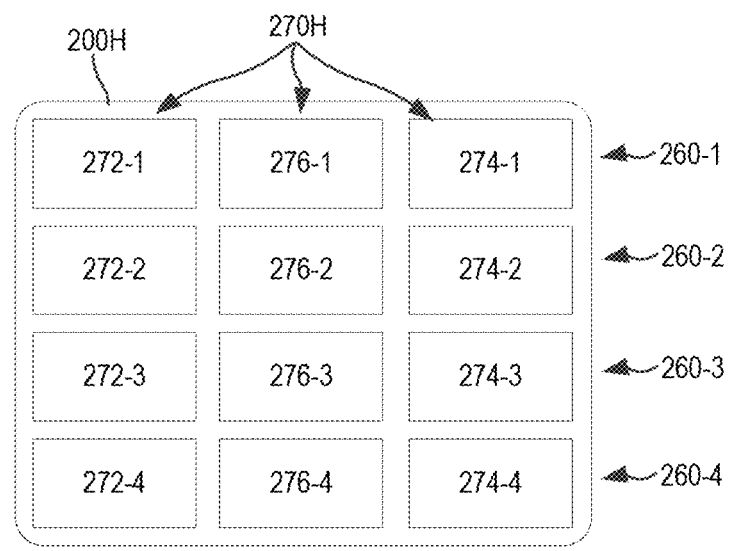
Figure 7C:
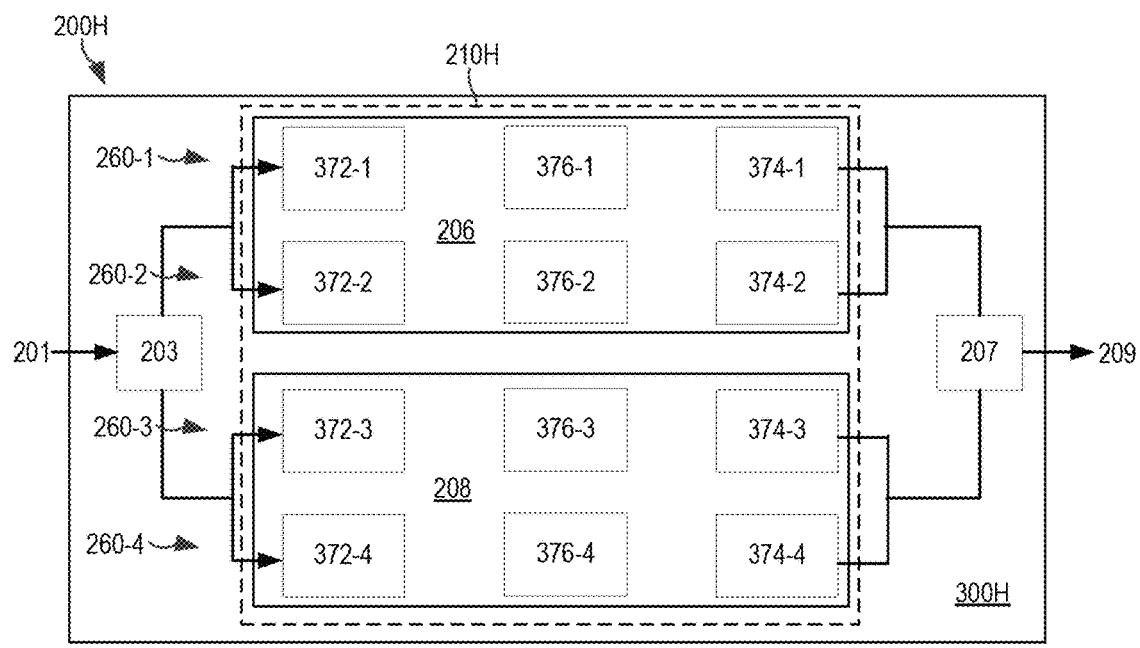

FIGS. 7A-7C schematically illustrate a Doherty RF transistor amplifier 200H according to embodiments of the present invention. As shown in FIG. 7A, the Doherty RF transistor amplifier 200H includes an RF input 201, an input splitter 203, a main amplifier 206, a peaking amplifier 208, an output combiner 207 and an RF output 209. The Doherty RF transistor amplifier 200H may optionally include input matching networks and/or an output matching networks (not shown).

As shown in FIG. 7B, the RF transistor amplifier die 210H included in RF transistor amplifier 200H is divided into a total of four zones 260-1 through 260-4, with each zone 260 interconnected with a respective gate interconnect pad 372 and a respective drain interconnect pad 374. FIG. 7C illustrates how the input splitter 203 and the output combiner 207 may be implemented on an interconnect structure 300H of RF transistor amplifier 200H, and how the different zones 260 of RF transistor amplifier die 210H may be interconnected to implement a Doherty amplifier. In the particular example shown in FIG. 7C, two zones 260 are used to implement the main amplifier 206 and two zones 260 are used to implement the peaking amplifier 208.

Figure 7D:
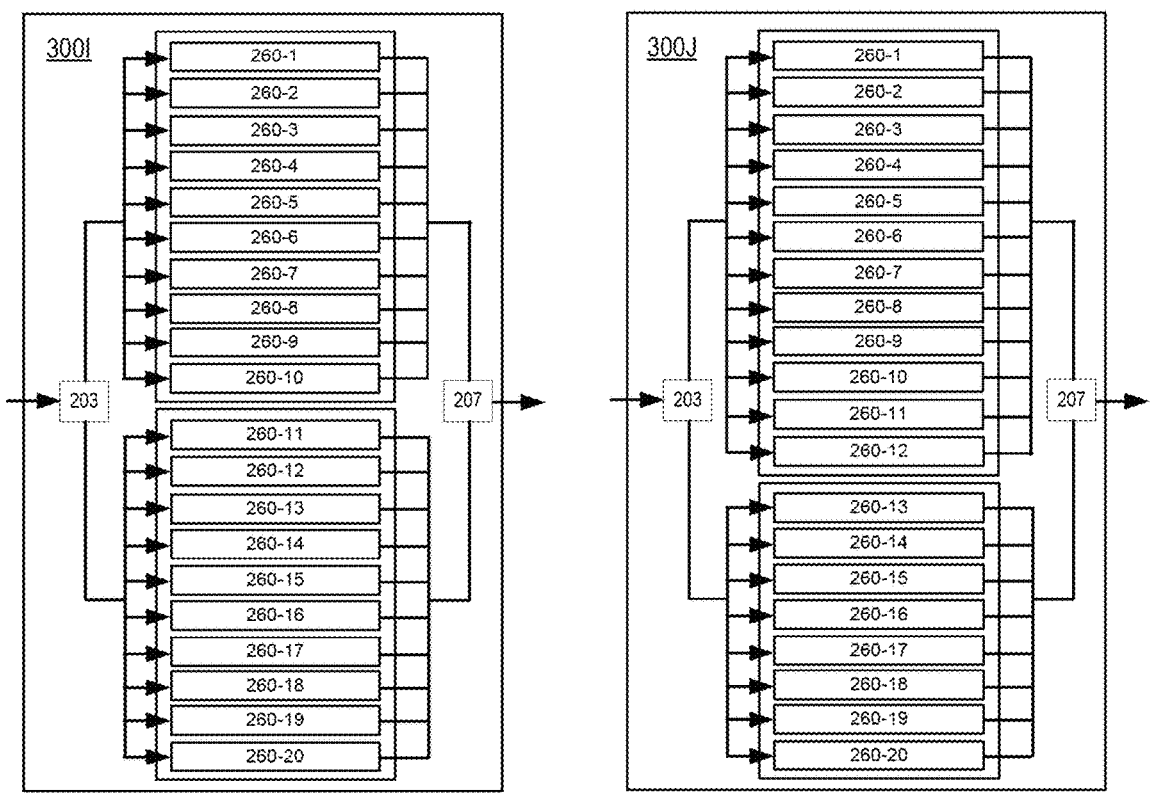

In some embodiments, the RF transistor amplifier die 210H may include a much larger number of zones 260 (e.g., twenty zones). In such embodiments, different interconnect structures 300 may be provided that each electrically connect different numbers of zones 260 to the main and peaking amplifiers 206, 208. For example, a first interconnect structure 300I may electrically connect the first output of input splitter 203 and the first input of output combiner 207 to zones 260-1 through 260-10 and may electrically connect the second output of input splitter 203 and the second input of output combiner 207 to zones 260-11 through 260-20, as is schematically shown in FIG. 7D. As shown in FIG. 7E, a second interconnect structure 300J may electrically connect the first output of input splitter 203 and the first input of output combiner 207 to zones 260-1 through 260-12 and may electrically connect the second output of input splitter 203 and the second input of output combiner 207 to zones 260-13 through 260-20 so that the main amplifier 206 has higher power handling capabilities as compared to the peaking amplifier 208. Additional interconnect structures may be provided that implement other splits. In this way, a single RF transistor amplifier die 210H may be used to in conjunction with a set of interconnect structures to provide a series of Doherty amplifiers. This is advantageous as it may be much easier to design and fabricate different interconnect structures as compared to designing and fabricating RF transistor amplifier die that implement the different power splits between the main and peaking amplifiers 206, 208.

The above-described techniques may also be used to implement RF transistor amplifiers having other configurations.

Figure 8A:
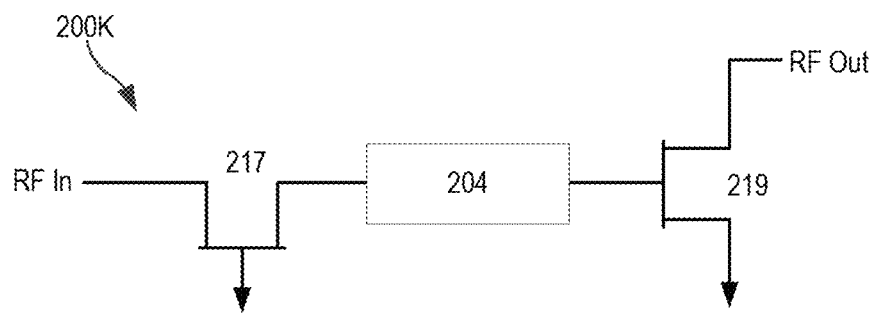
FIG. 8A is a circuit diagram of an RF transistor amplifier having a common-gate common-source configuration.

For example, FIG. 8A is a circuit diagram of an RF transistor amplifier 200K that has a common-gate common-source or "CGCS" configuration. As shown in FIG. 8A, the RF transistor amplifier 200K includes a first "common gate" transistor amplifier 217 (i.e., the gate of the first transistor amplifier 217 is coupled to ground), an optional inter-stage impedance matching network 204 and a second "common source" transistor amplifier 219 (i.e., the source of the second transistor amplifier 219 is coupled to ground). The first stage of RF transistor amplifier 200K acts as a transimpedance amplifier and works as a current buffer and voltage amplifier of an RF input signal that is input at the source of the first common-gate transistor amplifier 217. The drain of the first common-gate transistor amplifier 217 may either be DC or AC coupled to the gate of the second common source transistor amplifier 219. As noted above, an optional inter-stage impedance matching network 204 may be coupled between the drain of the first common-gate transistor amplifier 217 and the gate of the second common source transistor amplifier 219 in order to improve performance of a targeted frequency band. The RF transistor amplifier 200K may exhibit improved impedance matching bandwidth and also is a potential way to implement enhancement mode amplifiers in Group III nitride on SiC based material systems.

Figure 8B:
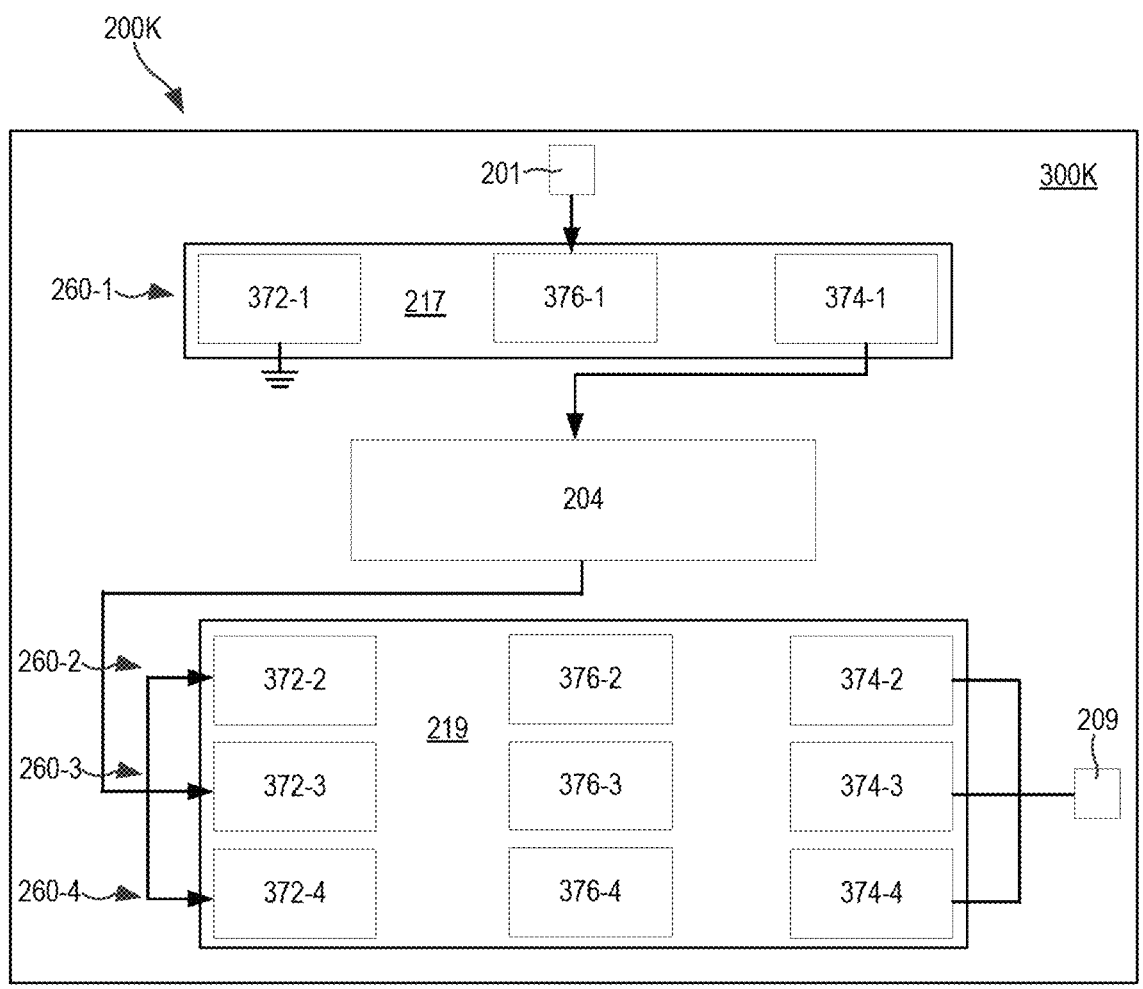
FIG. 8B is a schematic view illustrating a common-gate common-source RF transistor amplifier according to embodiments of the present invention.

FIG. 8B is a schematic view illustrating how the CGCS RF transistor amplifier 200K of FIG. 8A may be implemented according to embodiments of the present invention. As shown in FIG. 8B, the CGCS RF transistor amplifier 200K includes an RF input 201, the common-gate transistor amplifier 217, an inter-stage impedance matching network 204, the common source transistor amplifier 219 and an RF output 209. The CGCS RF transistor amplifier 200K may optionally include input matching networks and/or an output matching networks (not shown).

As shown in FIG. 8B, the RF transistor amplifier die included in RF transistor amplifier 200K is divided into a total of four zones 260-1 through 260-4. The first zone 260-1 may be used to implement the first common-gate transistor amplifier 217. The RF input 201 is coupled to the source interconnect pad 376-1 and the gate interconnect pad 372-1 is coupled to electrical ground to form the common-gate transistor amplifier 217. The drain interconnect pad 374-1 may be coupled to the input of the inter-stage impedance matching network 204. The output of inter-stage impedance matching network 204 is coupled to a power splitter that feeds the output signal to gate interconnect pads 372-2 through 372-4 for the three remaining zones 260-2 through 260-4. These zones are used to implement the second common source transistor amplifier 219. The inter-stage impedance matching network 204 and the power splitter may, for example, be implemented on an interconnect structure 300K of RF transistor amplifier 200K. The drain interconnect pads 374-2 through 374-4 of the second common source transistor amplifier 219 are coupled to the RTF output 209.

Figure 9:
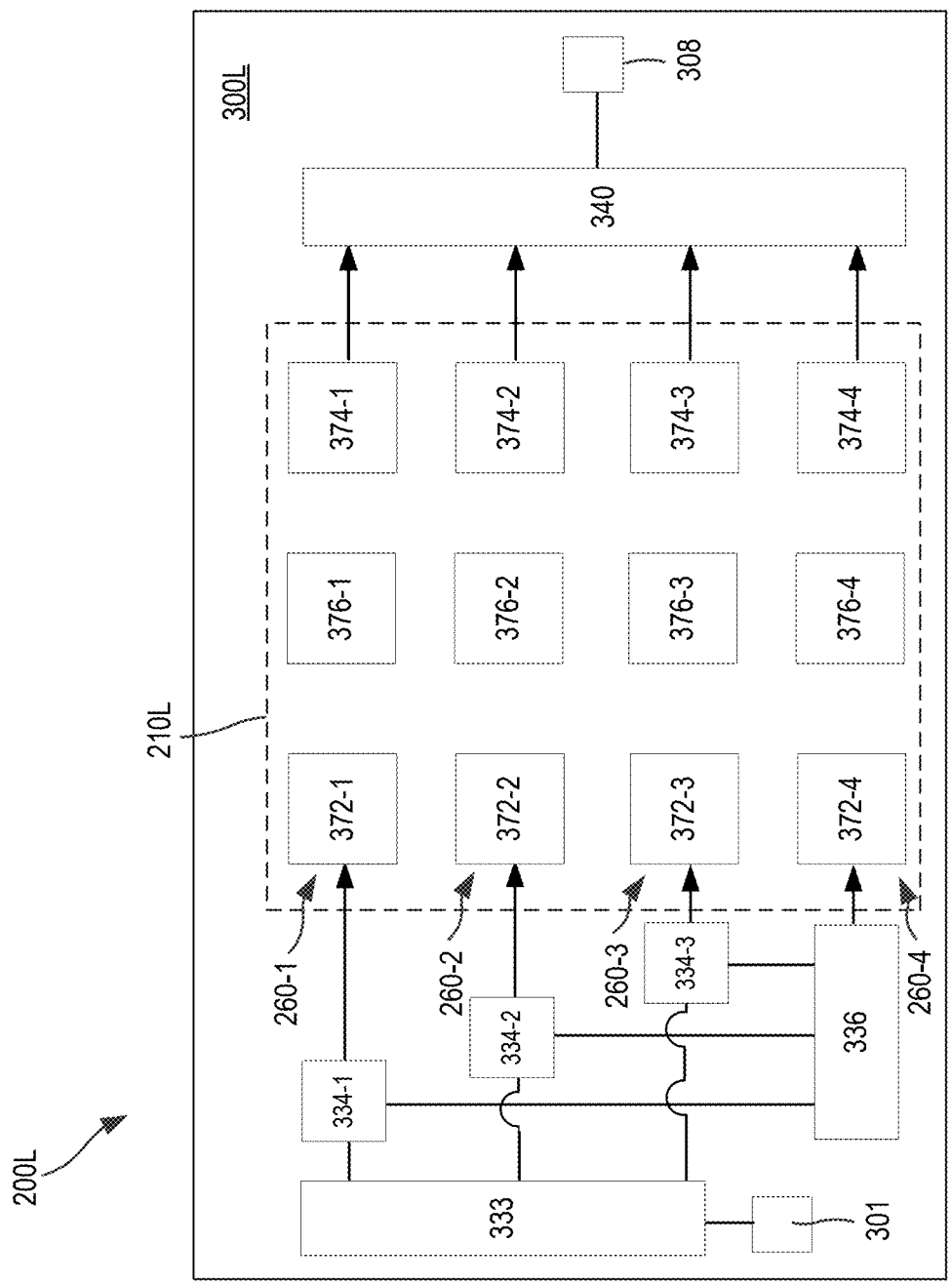
FIG. 9 is a schematic view of an RF transistor amplifier according to embodiments of the present invention that includes a redundant amplifier circuit.

Pursuant to still further embodiments of the present invention, RF transistor amplifiers having one or more redundant amplifier circuits may be provided. These RF transistor amplifiers may include a multi-zone RF transistor amplifier die, and at least one of the zones may be designated as a redundant zone that is not initially used. These RF transistor amplifiers may further include input and output switching networks that may be used to bypass a zone that is not operating properly and to switch the redundant zone into the circuit in place of the bypassed zone. These RF transistor amplifiers may further include detection circuitry (not shown) that detects when a zone of the RF transistor amplifier die has failed or otherwise is not operating properly. Upon detection of such a failure, the input and output switching networks may be reconfigured to switch operation from the failed zone of the circuit to a redundant zone. FIG. 9 is a schematic view of an RF transistor amplifier 200L according to embodiments of the present invention that includes such a redundant amplifier circuit.

As shown in FIG. 9, the RF transistor amplifier 200L includes an RF transistor amplifier die 210L that is mounted on an interconnect structure 300L. RF transistor amplifier die 210L is divided into four zones 260-1 through 260-4. Zones 260-1 through 260-3 are "primary" zones that are used in normal operation of RF transistor amplifier die 210L. Zone 260-4 is a redundant zone that may be switched in place of one of zones 260-1 through 260-3 if a failure occurs in one or more of those zones 260-1 through 260-3.

The interconnect structure 300L includes an input splitter 333, three switches 334-1 through 334-3, and an input combiner 336. The input splitter 333 may be connected to an RF input 301 that is provided on the interconnect structure 300L, and may split RF signals that are received at RF input 201 into three sub-components that are output on the three output lines of input splitter 333. Each output line of input splitter 333 is connected to a respective RF switch 334-1 through 334-3 (e.g., by conductive patterns 320 on the interconnect structure 300L). Each RF switch 334 has a pair of outputs, and depending upon the setting of the RF switch 334 will output an RF signal received at the input of the RF switch 334 to one of the two outputs. The first output of RF switch 334-1 is coupled to zone 260-1, the first output of RF switch 334-2 is coupled to zone 260-2, and the first output of RF switch 334-3 is coupled to zone 260-3. The second output of each RF switch 334 is coupled to the input combiner 336.

The RF signals passed to zones 260-1 through 260-3 are amplified RF transistor amplifier die 210L. In the depicted embodiment, the amplified RF signals output by zones 260-1 through 260-3 are fed to the combiner 340. The output of zone 260-4 is also passed to the combiner 340. An output of combiner 340 is coupled to an RF output 308 on interconnect structure 300L.

In operation, initially each RF switch 334 is set to connect the input thereof to its first output. As a result, the RF transistor amplifier die 210L will operate with the first through third zones 260-1 through 260-3 electrically disposed in parallel between the RF input 301 and the RF output 308. The fourth zone 260-4 is isolated from the RF input 301 by RF switches 334. If the above-described detection circuitry detects that a failure has occurred in one of zones 260-1 through 260-3 of RF transistor amplifier die 210L (e.g., the second zone 260-2), then control signals may be sent to control inputs (not shown) of RF switch 334-2 so that RF signals are not passed to failed zone 260-2. Resetting switch 334-2 also acts to place the zone 260-4 in parallel with the first and third zones 260-1, 260-3 so that the fourth zone 260-4 effectively replaces the second zone 260-2. In this manner, RF transistor amplifiers may be provided that have on-die redundancy circuits.

While in the depicted embodiment, all four of zones 260-1 through 260-4 are directly connected to combiner 340, in practice it may be beneficial to add switches between the zone outputs and the combiner 340. Three of the switched will pass the amplified RF signals to the combiner 340) and the fourth switch will be set to terminate the inactive zone 260 to ground.

Another problem that may arise as RF transistor amplifiers are made larger is that it may be difficult to ensure that an RF input signal passes through each of the parallel amplification paths of an RF transistor amplifier having a relatively constant wave front. In conventional RF transistor amplifiers, an RF signal may be input to a gate terminal of the RF transistor amplifier. The RF signal passes from the gate terminal to one or more gate manifolds which connect the gate terminal to the gate fingers of the amplifier. The RF signal may be input, for example, at the middle of the gate terminal and then travels along the gate terminal to pillars or other conductive structures that connect the gate terminal to the gate manifolds. Unfortunately, with this arrangement, the electrical length of the RF transmission path to each gate finger may vary, and the difference in electrical path length between the gate fingers in the middle of the RF transistor amplifier die and the gate fingers located near the ends of the RF transistor amplifier die may be significant. As a result, the phase of the subcomponents of the RF signal that are passed to each gate finger varies. This variation results in less than perfect combining of the amplified RF signals. The same exact issue is experienced in reverse at the output side of the device as the amplified RF signals are combined and passed to the drain terminal.

Figure 10:
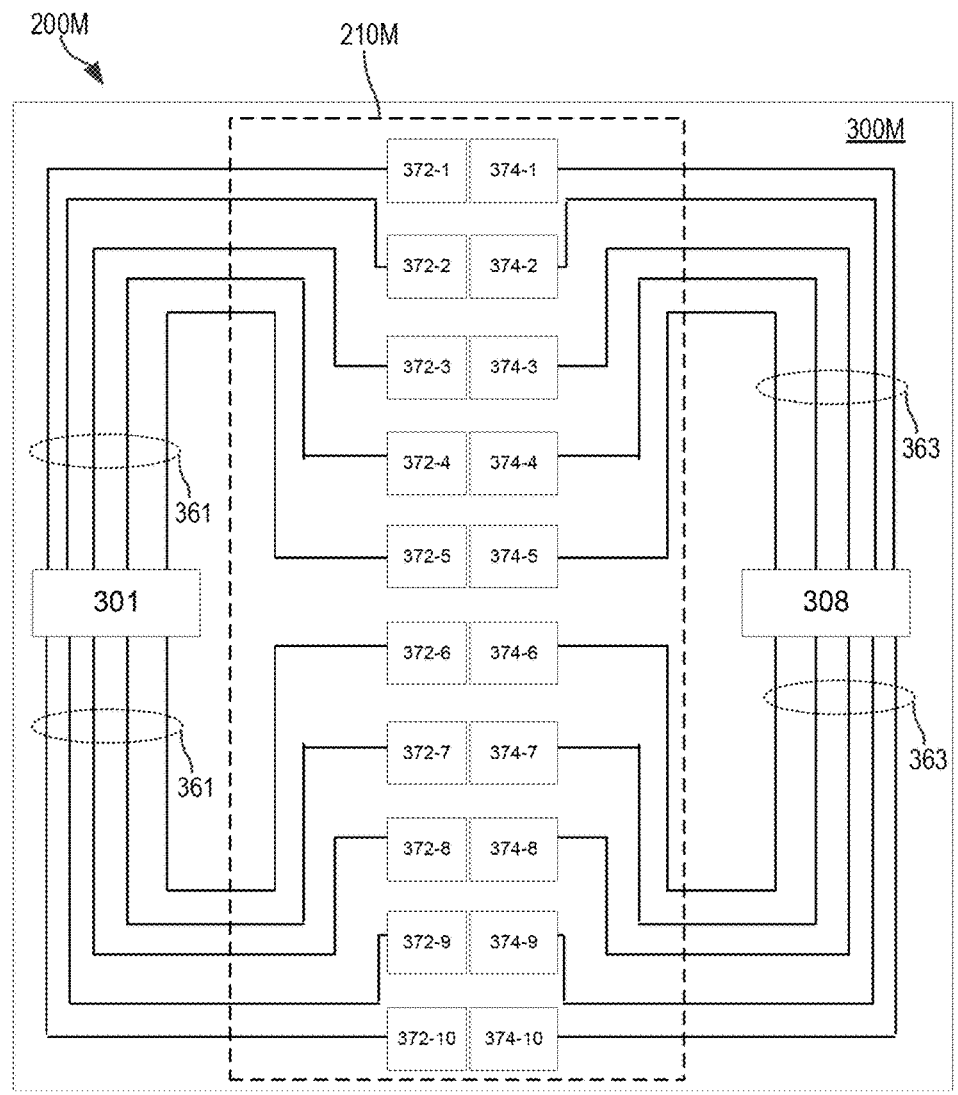
FIG. 10 is a schematic diagram illustrating an RF transistor amplifier according to embodiments of the present invention that has equal length RF transmission paths to multiple different zones of the RF transistor amplifier die.

Pursuant to embodiments of the present invention, RF transistor amplifiers are provided which much more tightly maintain phase consistency across the gate fingers of the amplifier. FIG. 10 is a schematic diagram illustrating an RF transistor amplifier 200M according to embodiments of the present invention that has equal length RF transmission paths to each of a plurality of different zones of an RF transistor amplifier die in order to maintain better phase consistency. The discussion below refers to both "physical" lengths and "electrical" lengths of RF transmission lines. The physical length refers to a measured length of an RF transmission line. The electrical length refers to a length of the RF transmission line as experienced by an electrical signal traversing the RF transmission line. As known to those of skill in the art, the electrical length of an RF transmission line may vary based on, for example, the dielectric constants of the dielectric material adjacent the conductive structures of the RF transmission line. As such, two RF transmission lines having the same physical length may have different electrical lengths if, for example, different dielectric materials are used in forming the RF transmission lines. In order to maintain phase consistency, the electrical lengths of two RF transmission lines should be substantially the same. Herein, "substantially" means within +/−5%.

As shown in FIG. 10, the RF transistor amplifier 200M includes an RF transistor amplifier die 210M that is mounted on an interconnect structure 300M. The RF transistor amplifier die 210M is mounted below the interconnect structure 300M in the schematic view of FIG. 10, and hence is shown using dashed lines. The interconnect structure 300M has an RF input 301, a plurality of gate interconnect pads 372, a plurality of drain interconnect pads 374 and an RF output 308. A plurality of first transmission lines 361 connect the RF input to the respective gate interconnect pads 372, and a plurality of second transmission lines 363 connect the respective drain interconnect pads 374 to the RF output 308. Each gate interconnect pad 372 and a corresponding drain interconnect pad 374 are connected to a respective zone 260 of the RF transistor amplifier die 210M as previously discussed.

As can be seen in FIG. 10, all of the first transmission lines 361 may have approximately the same length and all of the second transmission lines 363 may have approximately the same length. As a result, the sub-components of an RF signal that is input at RF input 301 may arrive at the respective gate interconnect pads 372 at the same time (i.e., in-phase). Likewise, the amplified RF signals output to the drain interconnect pads 374 may pass in-phase to the RF output 308. Thus, since each zone 260 of the multi-zone RF transistor amplifier die 210M may be individually fed, and since the first and second transmission lines 361, 363 may readily be formed to have the same length, it may be easy to maintain good phase uniformity with respect to the RF signals passing through the RF transistor amplifier 200M. Moreover, this phase uniformity may be maintained even as the size of the RF transistor amplifier die 210M is increased.

Figure 11A:
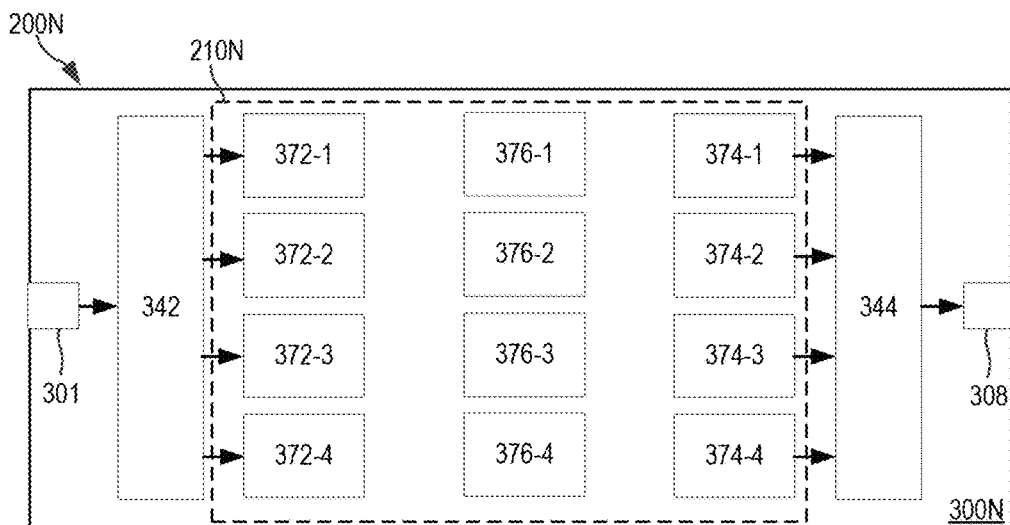
FIG. 11A is a schematic view of an RF transistor amplifier according to embodiments of the present invention that has an interconnect structure with a switching circuit that may be used to select different combinations of zones.
Figure 11B:
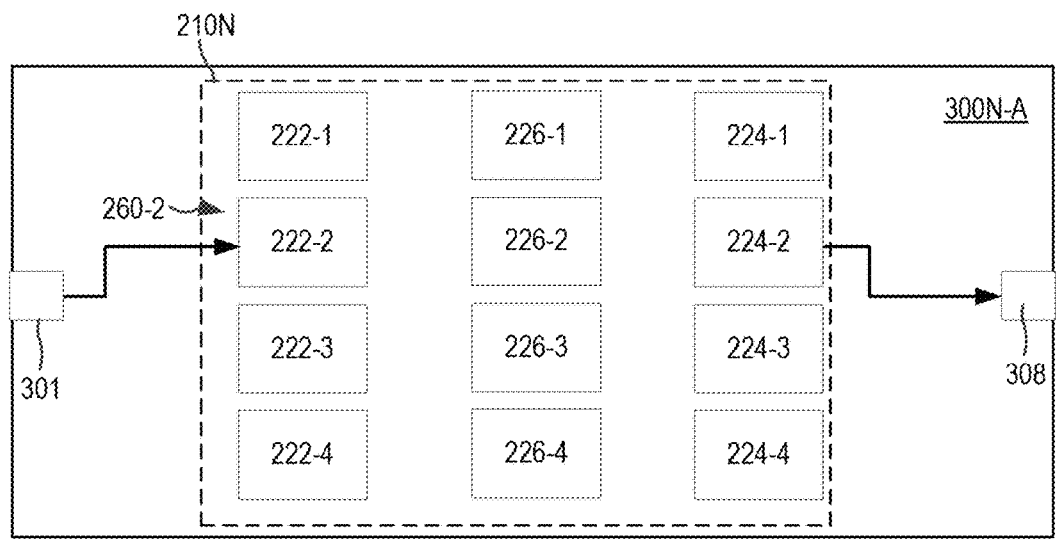
FIG. 11B is a schematic view illustrating how an RF transistor amplifier die may be mated with different interconnect structures to provide a series of RF transistor amplifier dies that support different power levels.
Figure 11B:
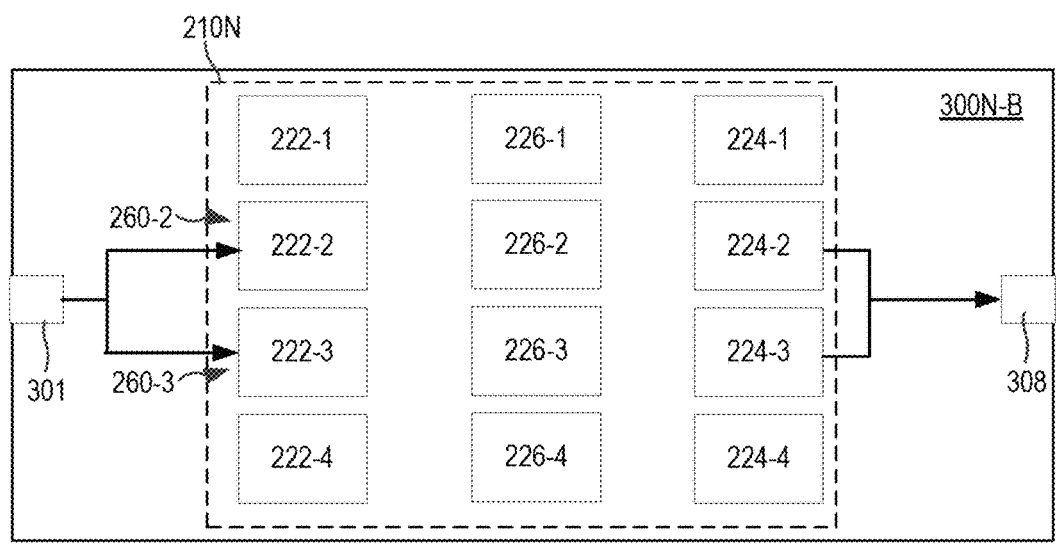
Figure 11B:
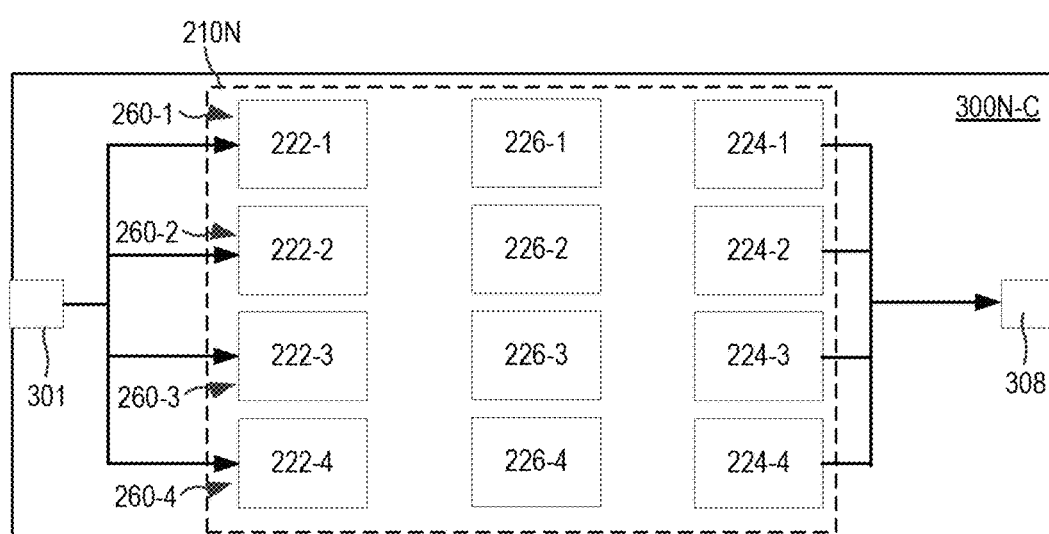

Multi-zone RF transistor amplifier dies may also facilitate providing RF transistor amplifiers that may operate at increased efficiency levels. Higher efficiency levels may be achieved by only using a subset of the zones 260 during lower power operation. FIGS. 11A and 11B schematically illustrate an RF transistor amplifier 200N according to embodiments of the present invention that is designed to adjust the number of zones 260 used based on, for example, the input or output power levels of the RF transistor amplifier 200N.

FIG. 11A is a schematic view of the RF transistor amplifier 200N. As shown in FIG. 11A, the RF transistor amplifier 200N includes an RF transistor amplifier die 210N and an interconnect structure 300N. The RF transistor amplifier die 210N is divided into four zones 260-1 through 260-4 (which correspond to gate and drain interconnect pads 372-1, 374-1; 372-2, 374-2; 372-3, 374-3; 372-4, 374-4). The interconnect structure 300N includes an RF input 301, an input switching network 342, gate interconnect pads 372-1 through 372-4, drain interconnect pads 374-1 through 374-4, an output switching network 344 and an RF output 308. The input switching network 342 may comprise a matrix switch that may connect the RF input 301 to any combination of one or more of the gate interconnect pads 372. The output switching network 344 may comprise a matrix switch that may connect the RF output 308 to any combination of one or more of the drain interconnect pads 374. A power sensor or some other circuit that determines a power of the RF signals (e.g., an input power, an output power, etc.) may be used to determine how the input switch 342 and the output switch 344 are set.

Instead of using switching networks 342, 344, it may instead be possible to use a selected one of a plurality of different interconnect structures with a single RF transistor amplifier die in order to optimize operation of the die. This is shown with reference to FIG. 11B.

In particular, referring to the top diagram in FIG. 11B, it can be seen that if an RF transistor amplifier is required that will operate at low power levels, a first interconnect structure 300N-A may be used that may be hardwired to only connect the RF input 301 and RF output 308 thereof to a single zone (zone 260-2) of the RF transistor amplifier die 210N. Referring to the middle diagram in FIG. 11B, it can be seen that if an RF transistor amplifier die is required that will operate at moderate power levels, a second interconnect structure 300N-B may be used that may be hardwired to connect the RF input 301 and RF output 308 thereof to two of the zones of the RF transistor amplifier die 210N (zones 260-2 and 260-3). Referring to the bottom diagram in FIG. 11B, it can be seen that if an RF transistor amplifier die is required that will operate at high power levels, a third interconnect structure 300N-C may be used that may be hardwired to connect the RF input 301 and RF output 308 thereof to all four zones 260-1 through 260-4 of RF transistor amplifier die 210N. In this manner, a single RF transistor amplifier die 210N may be designed that may be configured to operate efficiently in applications that use a wide variety of different power levels.

The multi-zone RF transistor amplifier dies according to embodiments of the present invention that have been discussed above have been shown for convenience as having the same number of gate terminals, drain terminals and source terminals. It will be appreciated, however, that embodiments of the present invention are not limited thereto. For example, any number of source terminals may be provided in many applications as the source terminals are typically connected to a common ground reference. Moreover, the number of gate terminal and drain terminals also need not be the same. For example, the number of gate terminals could be twice the number of drain terminals, depending upon how the zones are interconnected through the interconnect structure. Alternatively, the number of drain terminals may exceed the number of gate terminals.

The RF transistor amplifiers according to embodiments of the present invention may be partially or completely enclosed in packaging material (with leads or other contact structures extending through the packaging in order to provide packaged RF transistor amplifiers. Any suitable packaging technologies may be used. FIGS. 12A-12D illustrate several examples of different ways that the RF transistor amplifiers according to embodiments of the present invention may be packaged.

Figure 12A:
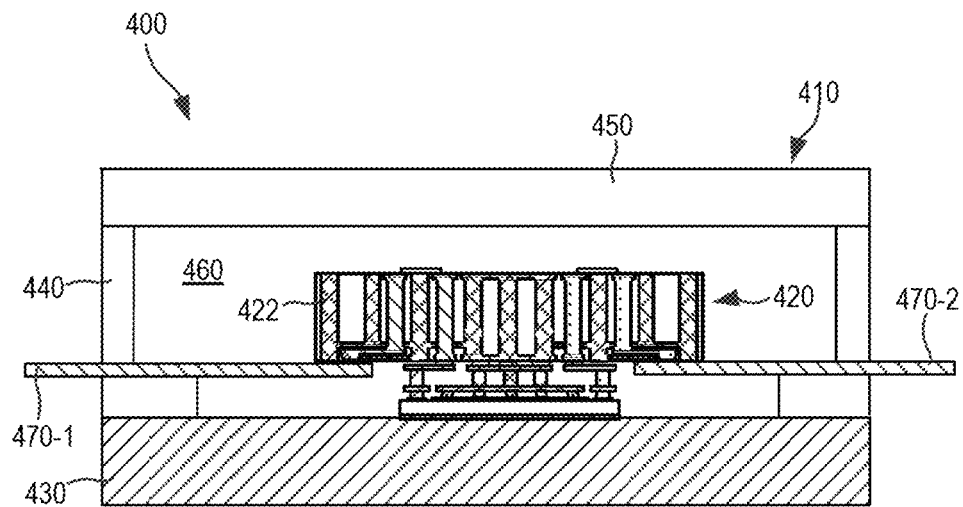
FIGS. 12A-12D are schematic cross-sectional views of packaged RF transistor amplifiers according to embodiments of the present invention.

In particular, FIG. 12A is a schematic cross-sectional view of a packaged RF transistor amplifier 400 that includes one of RF transistor amplifiers according to embodiments of the present invention (which is generically labeled 420 in FIG. 12A). As shown in FIG. 12A, packaged RF transistor amplifier 400 includes a package 410 with the RF transistor amplifier 420 enclosed therein.

The package 410 comprises a ceramic package that includes a carrier substrate 430, sidewalls 440 and a lid 450 that together define an open-cavity 460. The RF transistor amplifier 410 (including its interconnect structure 422) is disposed on the carrier substrate 430 within the open-cavity 460.

The carrier substrate 430 may include materials configured to assist with the thermal management of the package 410. For example, the carrier substrate 430 may include copper and/or molybdenum. In some embodiments, the carrier substrate 430 may be composed of multiple layers and/or contain vias/interconnects. In an example embodiment, the carrier substrate 430 may be a multilayer copper/molybdenum/copper metal flange that comprises a core molybdenum layer with copper cladding layers on either major surface thereof. The sidewalls 440 and/or lid 450 may be formed of or include an insulating material in some embodiments. For example, the sidewalls 440 and/or lid 450 may be formed of or include ceramic materials. In some embodiments, the sidewalls 440 and/or lid 450 may be formed of, for example, $Al_2O_3$. The lid 450 may be glued to the sidewalls 440 using an epoxy glue. The sidewalls 440 may be attached to the carrier substrate 430 via, for example, braising. Leads 470-1, 470-2 may be configured to extend through the sidewalls 440, though embodiments of the present invention are not limited thereto. The leads 470 may be coupled to the interconnect structure 422 using, for example, a conductive die attach material. In the depicted embodiment, the leads 470) are connected to the interconnect structure 422 without the use of any wire bonds.

Figure 12B:
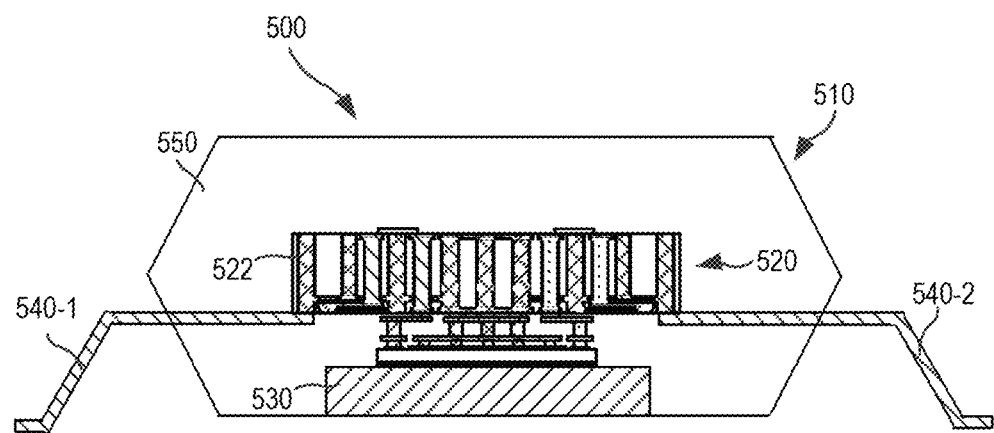

FIG. 12B is a schematic cross-sectional view of a packaged RF transistor amplifier 500 that includes one of RF transistor amplifiers according to embodiments of the present invention (which is generically labeled 520 in FIG. 12B) in an overmold plastic package. The packaged RF transistor amplifier 500 includes a package 510 with the RF transistor amplifier 520 enclosed therein.

The package 500 includes the carrier substrate 530, leads 540-1, 540-2 and overmold plastic material 550. The RF transistor amplifier 520 (including interconnect structure 522) is disposed on the carrier substrate 530. The leads 540-1, 5402 are connected to the interconnect structure 522 (e.g., in the same manner described above with reference to FIG. 12A). The overmold material 550, which may be a plastic or a plastic polymer compound, is injection molded around RF transistor amplifier 520 (including interconnect structure 522), thereby providing protection from the outside environment.

The carrier substrate 530 of package 500 may include materials configured to assist with thermal management. For example, the carrier substrate 530 may include copper and/or molybdenum. In some embodiments, the carrier substrate 530 may be composed of multiple layers and/or contain vias/interconnects. In some embodiments, the carrier substrate 530 may include a metal heat sink that is part of a lead frame or metal slug that is at least partially surrounded by a plastic overmold plastic 550.

Figure 12C:
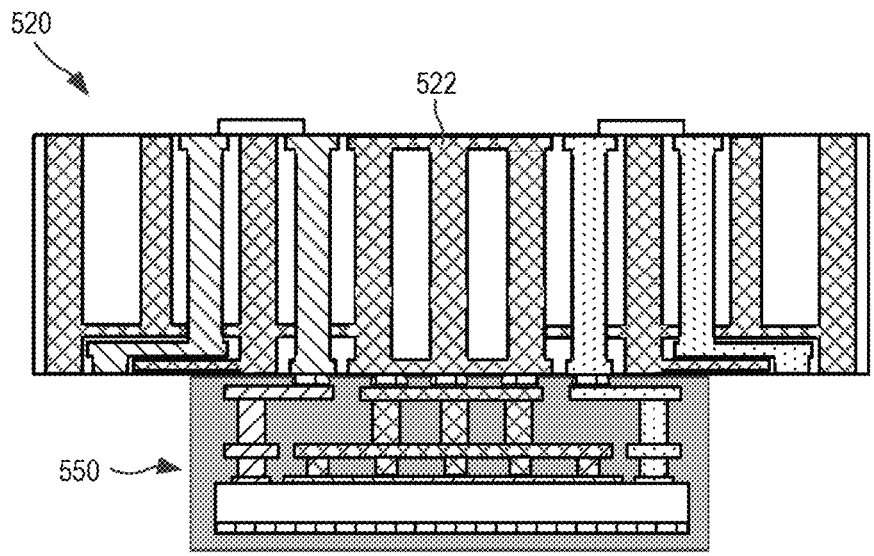
Figure 12D:
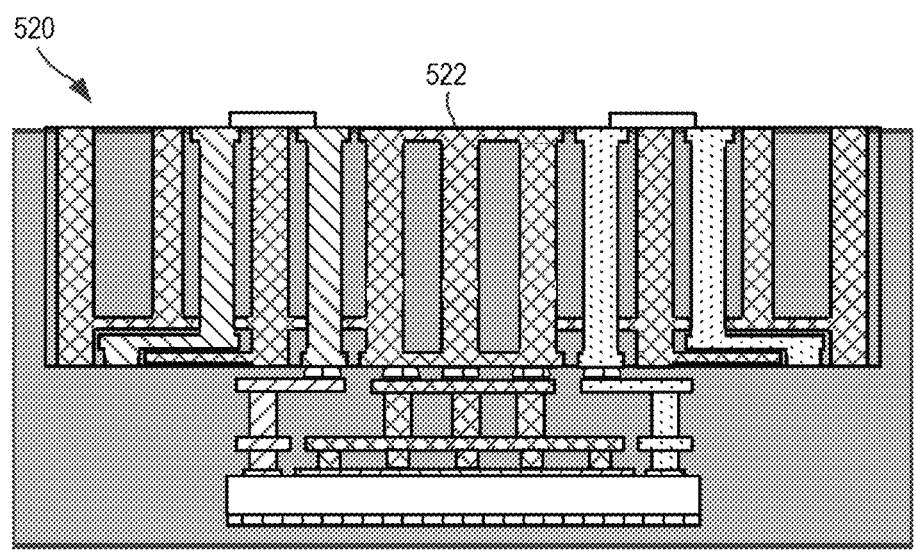

As shown in FIG. 12C, in other embodiments, only the RF transistor amplifier die and the coupling element may be encapsulated within the overmold plastic material, and pads or other structures on the interconnect structure 522 may serve as the leads for the RF transistor amplifier. As shown in FIG. 12D, in still other embodiments all three of the RF transistor amplifier die 520, the coupling element 524 and the interconnect structure 522 may be encapsulated. Openings may be formed within the encapsulation material to provide access to various terminals of the device (e.g., an RF input terminal, an RF output terminal, a ground terminal, bias voltage terminals, etc.).

It will be appreciated that any of the RF transistor amplifiers according to embodiments of the present invention that are discussed herein may be mounted in packages such as the packages shown in FIGS. 12A-12D.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising." "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") transistor amplifier, comprising:
    an RF transistor amplifier die having a Group III nitride-based semiconductor layer structure that comprises a Group III nitride based channel layer and a Group III nitride based barrier layer on the Group III nitride based channel layer, the Group III nitride based barrier layer having a higher bandgap than the Group III nitride based channel layer; and
    a plurality of unit cell transistors that are formed at least partially in the Group III nitride-based semiconductor layer structure,
    wherein a first of the unit cells comprises a first drain finger, a first source finger and a first gate finger that is positioned in between the first drain finger and the first source finger, and a second of the unit cells comprises a second drain finger, a second source finger and a second gate finger that is positioned in between the second drain finger and the second source finger, and
    wherein the first gate finger has a first length and the second gate finger has a second length that is different than the first length.

2. The RF transistor amplifier of claim 1, wherein the RF transistor amplifier die is divided into a plurality of zones that are configured for operation in different frequency bands, and wherein the first of the gate fingers is in a first of the zones and the second of the gate fingers is in a second of the zones.

3. The RF transistor amplifier of claim 2, wherein the first of the zones is configured to amplify RF signals in a first frequency range and the second of the zones is configured to amplify RF signals in a second frequency range that is different from the first frequency range.

4. The RF transistor amplifier of claim 3, further comprising:
    an interconnect structure on a surface of the RF transistor amplifier die; and
    a coupling element between the RF transistor amplifier die and the interconnect structure that electrically connects the RF transistor amplifier die to the interconnect structure.

5. The RF transistor amplifier of claim 4, wherein the interconnect structure includes a first RF input that corresponds to the first zone and a second RF input that corresponds to the second zone.

6. The RF transistor amplifier of claim 5, wherein a plurality of circuit elements are mounted on the interconnect structure.

7. The RF transistor amplifier of claim 6, wherein the circuit elements comprise at least one of a surface mount capacitor and a surface mount inductor.

8. The RF transistor amplifier of claim 2, wherein the RF transistor amplifier die further includes a plurality of gate terminals, a plurality of drain terminals, and at least one source terminal, and wherein each of the gate terminals is coupled to a respective one of the plurality of zones.

9. A radio frequency ("RF") transistor amplifier, comprising:
    an RF transistor amplifier die having a Group III nitride-based semiconductor layer structure and a plurality of gate manifolds;
    an interconnect structure on an upper surface of the RF transistor amplifier die, the interconnect structure including an RF input;
    a coupling element between the RF transistor amplifier die and the interconnect structure that electrically connects the RF transistor amplifier die to the interconnect structure; and
    a plurality of RF transmission lines that extend from the RF input to the respective gate manifolds, where each of the RF transmission lines has substantially the same electrical length.

10. The RF transistor amplifier of claim 9, wherein each of the RF transmission lines has substantially the same physical length.

11. The RF transistor amplifier of claim 9, wherein the RF transistor amplifier die is divided into a plurality of zones and each of the zones includes a plurality of unit cell transistors, and wherein each gate manifold is connected to the unit cell transistors of a respective one of the zones.

12. The RF transistor amplifier of claim 9, wherein the coupling element comprises a plurality of conductive pillars and the interconnect structure comprises a redistribution layer laminate structure and/or a printed circuit board.

13. The RF transistor amplifier of claim 9, wherein some of the RF transmission lines comprise meandered RF transmission lines.

14. A radio frequency ("RF") transistor amplifier, comprising:
    an RF transistor amplifier die having a Group III nitride-based semiconductor layer structure that comprises a Group III nitride based channel layer and a Group III nitride based barrier layer on the Group III nitride based channel layer, the Group III nitride based barrier layer having a higher bandgap than the Group III nitride based channel layer; and
    an interconnect structure on an upper surface of the RF transistor amplifier die, the interconnect structure including an RF input;
    an input splitter;
    an output combiner;
    wherein the RF transistor amplifier die is divided into a plurality of zones, wherein each of the zones includes a plurality of unit cell transistors that are formed at least partially in the Group III nitride-based semiconductor layer structure, and
    wherein a first set of one or more of the plurality of zones implements a main amplifier of a Doherty amplifier and a second set of one or more of the plurality of zones implements a peaking amplifier of the Doherty amplifier.

15. The RF transistor amplifier of claim 14, wherein the splitter is formed on the interconnect structure.

16. The RF transistor amplifier of claim 15, wherein the output combiner is formed on the interconnect structure.

17. The RF transistor amplifier of claim 14, wherein the interconnect structure comprises one of a plurality of different interconnect structures, and different of the interconnect structures connect to different numbers of the plurality of zones.

18. The RF transistor amplifier of claim 14, further comprising a coupling element that is positioned between the RF transistor amplifier die and the interconnect structure that electrically connects the RF transistor amplifier die to the interconnect structure.

19. The RF transistor amplifier of claim 18, wherein the coupling element comprises a plurality of conductive pillars and the interconnect structure comprises a redistribution layer laminate structure and/or a printed circuit board.

* * * * *